United States Patent
Myung et al.

(10) Patent No.: US 8,271,846 B2
(45) Date of Patent: Sep. 18, 2012

(54) METHOD AND APPARATUS FOR CHANNEL ENCODING AND DECODING IN A COMMUNICATION SYSTEM USING LOW-DENSITY PARITY-CHECK CODES

(75) Inventors: Seho Myung, Suwon-si (KR);
Hwan-Joon Kwon, Suwon-si (KR);
Kyung-Joong Kim, Pohang-si (KR);
Seok-Ki Ahn, Gumi-si (KR);
Kyeong-Cheol Yang, Seoul (KR);
Jae-Yoel Kim, Suwon-si (KR); Hak-Ju Lee, Incheon (KR)

(73) Assignees: Samsung Electronics Co., Ltd (KR);
Postech Academy Industry Foundation (KR)

( * ) Notice: Subject to any disclaimer, the term of this patent is extended or adjusted under 35 U.S.C. 154(b) by 825 days.

(21) Appl. No.: 12/393,704

(22) Filed: Feb. 26, 2009

(65) Prior Publication Data

US 2009/0217130 A1  Aug. 27, 2009

(30) Foreign Application Priority Data

Feb. 26, 2008 (KR) .......................... 10-2008-0017280
Mar. 11, 2008 (KR) .......................... 10-2008-0022472
Mar. 18, 2008 (KR) .......................... 10-2008-0025143

(51) Int. Cl.
*H03M 13/00* (2006.01)
(52) U.S. Cl. .................................................... 714/752
(58) Field of Classification Search .................. 714/712, 714/748–756, 774, 780, 781, 786–790, 795, 714/801
See application file for complete search history.

(56) References Cited

U.S. PATENT DOCUMENTS

| 7,519,895 B2 | 4/2009 | Kyung et al. |
| 7,581,159 B2* | 8/2009 | Hocevar ........................ 714/790 |
| 2003/0126551 A1* | 7/2003 | Mantha et al. ................ 714/790 |
| 2005/0216821 A1 | 9/2005 | Harada |
| 2005/0283708 A1 | 12/2005 | Kyung et al. |
| 2006/0107192 A1* | 5/2006 | Mantha et al. ................ 714/800 |
| 2007/0033486 A1 | 2/2007 | Hong et al. |
| 2007/0044000 A1 | 2/2007 | Shen et al. |
| 2007/0089025 A1 | 4/2007 | Hong et al. |

(Continued)

FOREIGN PATENT DOCUMENTS

EP  1 724 932  11/2006

(Continued)

OTHER PUBLICATIONS

Baldi et al.: "Variable Rate LDPC Codes for Wireless Applications", Proc. Softcom 2006, Sep. 1, 2006.

(Continued)

*Primary Examiner* — Nadeem Iqbal
(74) *Attorney, Agent, or Firm* — The Farrell Law Firm, P.C.

(57) ABSTRACT

A method for encoding a channel in a communication system using a Low-Density Parity-Check (LDPC) code is provided. The method includes determining a number of parity bits for puncturing; dividing the parity bits at predetermined intervals, and determining a number of puncturing parity bits, which are subjected to puncturing within the predetermined intervals; determining a modulation scheme; determining positions of puncturing parity bits corresponding to the determined number of the puncturing parity bits within the predetermined intervals according to the modulation scheme; repeatedly performing puncturing on puncturing parity bits corresponding to the determined positions at the predetermined intervals; and transmitting remaining bits except for the punctured bits according to the modulation scheme.

39 Claims, 16 Drawing Sheets

U.S. PATENT DOCUMENTS

| | | |
|---|---|---|
| 2007/0094580 A1 | 4/2007 | Livshitz |
| 2007/0101243 A1* | 5/2007 | Kim et al. ............... 714/790 |
| 2007/0226583 A1 | 9/2007 | Kim et al. |
| 2009/0307562 A1 | 12/2009 | Lee et al. |
| 2010/0107033 A1* | 4/2010 | Kuri et al. ............... 714/752 |
| 2011/0167315 A1 | 7/2011 | Kyung et al. |

FOREIGN PATENT DOCUMENTS

| | | |
|---|---|---|
| JP | 2006-094012 | 4/2006 |
| KR | 1020050118056 | 12/2005 |
| KR | 1020070009244 | 1/2007 |
| KR | 1020070034904 | 3/2007 |
| KR | 1020070054088 | 5/2007 |
| KR | 1020070080769 | 8/2007 |
| RU | 2 310 274 | 11/2007 |
| RU | 2 316 111 | 1/2008 |
| WO | WO 2006/079081 | 7/2006 |
| WO | WO 2007/091797 | 8/2007 |
| WO | WO 2007/145491 | 12/2007 |

OTHER PUBLICATIONS

Park et al.: "Efficient Puncturing Method for Rate-Compatible Low-Density Parity-Check Codes", IEEE Transactions on Wireless Communications, IEEE Service Center, vol. 6, No. 11, Nov. 1, 2007.

Ohtsuki: "LDPC Codes in Communications and Broadcasting", IEICE Transactions on Communications, Communications Society, vol. E90B, No. 3, Mar. 1, 2007.

DVB Broadcasting: "Frame Structure Channel Coding and Modulation for a Second Generation Digital Terrestrial Television Broadcasting System (DVB-T2)", XP-002667650, Jan. 1, 2008.

* cited by examiner $$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

FIG. 4
(RELATED ART)

METHOD AND APPARATUS FOR CHANNEL ENCODING AND DECODING IN A COMMUNICATION SYSTEM USING LOW-DENSITY PARITY-CHECK CODES

PRIORITY

This application claims priority under 35 U.S.C. §119(a) to a Korean Patent Application filed in the Korean Intellectual Property Office on Feb. 26, 2008 and assigned Serial No. 10-2008-0017280, a Korean Patent Application filed in the Korean Intellectual Property Office on Mar. 11, 2008 and assigned Serial No. 10-2008-0022472, and a Korean Patent Application filed in the Korean Intellectual Property Office on Mar. 18, 2008 and assigned Serial No. 10-2008-0025143, the disclosures of all of which are hereby incorporated by reference.

BACKGROUND OF THE INVENTION

1. Field of the Invention

The present invention relates to a communication system using Low-Density Parity-Check (LDPC) codes. More particularly, the present invention relates to a channel encoding/decoding method and apparatus for generating LDPC codes with various codeword lengths and code rates from an LDPC code given in high-order modulation.

2. Description of the Related Art

In wireless communication systems, link performance significantly decreases due to various noises in the channels, a fading phenomenon, and Inter-Symbol Interference (ISI). Therefore, in order to realize high-speed digital communication systems, which require high data throughput and reliability, such as the next-generation mobile communication, digital broadcasting, and portable Internet, it is important to develop technology for overcoming the channel noises, fading, and ISI. Recently, an intensive study of error-correcting codes has been conducted as a method for increasing communication reliability by efficiently recovering distorted information.

An LDPC code, first introduced by Gallager in 1960s, has lost favor over time due to its implementation complexity which could not be resolved by the technology at that time. However, as the turbo code, which was discovered by Berrou, Glavieux, and Thitimajshima in 1993, exhibits performance levels approximating Shannon's channel limit, research has been conducted on iterative decoding and channel encoding based on a graph along with analyses on performance and characteristics of the turbo code. With this as a momentum, the LDPC code was restudied in the late 1990s, which proved that the LDPC code exhibits performance levels approximating the Shannon's channel limit if the LDPC undergoes decoding by applying iterative decoding based on a sum-product algorithm on a Tanner graph (a special case of a factor graph) corresponding to the LDPC code.

The LDPC code is commonly represented using a graph representation technique, and many characteristics can be analyzed through the methods based on graph theory, algebra, and probability theory. Generally, a graph model of channel codes is useful for description of codes, and by mapping information on encoded bits to vertexes in the graph and mapping relations between the bits to edges in the graph, it is possible to consider the graph as a communication network in which the vertexes exchange predetermined messages through the edges, thus making it possible to derive a natural decoding algorithm. For example, a decoding algorithm derived from a trellis, which can be regarded as a kind of graph, may include the well-known Viterbi algorithm and a Bahl, Cocke, Jelinek and Raviv (BCJR) algorithm.

The LDPC code is generally defined as a parity-check matrix, and can be expressed using a bipartite graph, which is referred to as a Tanner graph. The bipartite graph is a graph where vertexes forming the graph are divided into two different types, and the LDPC code is represented with the bipartite graph consisting of vertexes, some of which are called variable nodes and the other of which are called check nodes. The variable nodes are one-to-one mapped to the encoded bits.

A graph representation method for the LDPC code will be described with reference to FIGS. 1 and 2.

FIG. 1 illustrates an example of a parity-check matrix $H_1$ of an LDPC code with 4 rows and 8 columns. Referring to FIG. 1, because the number of columns is 8, the parity-check matrix $H_1$ signifies an LDPC code that generates a length-8 codeword, and the columns are mapped to 8 encoded bits on a one to one basis.

FIG. 2 illustrates a Tanner graph corresponding to the parity-check matrix $H_1$ in FIG. 1.

Referring to FIG. 2, the Tanner graph of the LDPC code includes 8 variable nodes $x_1$ (202), $x_2$ (204), $x_3$ (206), $x_4$ (208), $x_5$ (210), $x_6$ (212), $x_7$ (214), and $x_8$ (216), and 4 check nodes 218, 220, 222, and 224. An $i^{th}$ column and a $j^{th}$ row in the parity-check matrix $H_1$ of the LDPC code are mapped to a variable node $x_i$ and a $j^{th}$ check node, respectively. In addition, a value of 1, i.e. a non-zero value, at the point where an $i^{th}$ column and a $j^{th}$ row in the parity-check matrix $H_1$ of the LDPC code cross each other, indicates that there is an edge between the variable node $x_i$ and the $j^{th}$ check node on the Tanner graph as shown in FIG. 2.

In the Tanner graph of the LDPC code, a degree of the variable node and the check node indicates the number of edges connected to each respective node, and the degree is equal to the number of non-zero entries in a column or row corresponding to the pertinent node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214), and $x_8$ (216) are 4, 3, 3, 3, 2, 2, 2, and 2, respectively, and degrees of check nodes 218, 220, 222, and 224 are 6, 5, 5, and 5, respectively. In addition, the numbers of non-zero entries in the columns of the parity-check matrix $H_1$ of FIG. 1, which correspond to the variable nodes in FIG. 2, coincide with their degrees 4, 3, 3, 3, 2, 2, 2, and 2, and the numbers of non-zero entries in the rows of the parity-check matrix $H_1$ of FIG. 1, which correspond to the check nodes in FIG. 2, coincide with their degrees 6, 5, 5, and 5.

In order to express degree distribution for the nodes of the LDPC code, a ratio of the number of degree-i variable nodes to the total number of variable nodes is defined as $f_i$, and a ratio of the number of degree-j check nodes to the total number of check nodes is defined as $g_j$. For example, for the LDPC code corresponding to FIGS. 1 and 2, $f_2=4/8$, $f_3=3/8$, $f_4=1/8$, and $f_i=0$ for $i \neq 2, 3, 4$; and $g_5=3/4$, $g_6=1/4$, and $g_j=0$ for $j \neq 5, 6$. When a length of the LDPC code, i.e. the number of columns, is defined as N, and the number of rows is defined as N/2, the density of non-zero entries in the entire parity-check matrix having the above degree distribution is computed as shown in Equation (1).

$$\frac{2f_2 N + 3f_3 N + 4f_4 N}{N \cdot N/2} = \frac{5.25}{N} \tag{1}$$

In Equation (1), as N increases, the density of 1's in the parity-check matrix decreases. Generally, as for the LDPC code, because the codeword length N is inversely proportional to the density of non-zero entries, the LDPC code with a large N has a very low density of non-zero entries. The term "low-density" in the name of the LDPC code originates from the above-mentioned relationship.

Next, with reference to FIG. 3, a description will be made of characteristics of a parity-check matrix of a structured LDPC code applicable to the present invention. FIG. 3 illustrates an LDPC code adopted as the standard technology in Digital Video Broadcasting-Satellite transmission $2^{nd}$ generation (DVB-S2), which is one of the European digital broadcasting standards.

In FIG. 3, $N_1$ and $K_1$ denote a codeword length and an information length (or a length of an information word) of an LDPC code, respectively, and $(N_1-K_1)$ provides a parity length. Further, integers $M_1$ and q are determined to satisfy $q=(N_1-K_1)/M_1$. Preferably, $K_1/M_1$ should also be an integer. The parity-check matrix in FIG. 3 will be referred to herein as a first parity-check matrix $H_1$, for convenience only.

Referring to FIG. 3, a structure of a parity part, i.e. $K_1^{th}$ column through $(N_1-1)^{th}$ column, in the parity-check matrix, has a dual diagonal shape. Therefore, as for degree distribution over columns corresponding to the parity part, all columns have a degree '2', except for the last column having a degree '1'.

In the parity-check matrix, a structure of an information part, i.e. $0^{th}$ column through $(K_1-1)^{th}$ column, is made using the following rules.

Rule 1: A total of $K_1/M_1$ column groups are generated by grouping $K_1$ columns corresponding to the information word in the parity-check matrix into multiple groups each including $M_1$ columns. A method for forming columns belonging to each column group follows Rule 2 below.

Rule 2: First, positions of '1's in each $0^{th}$ column in $i^{th}$ column groups (where $i=1, \ldots, K_1/M_1$) are determined. When a degree of a $0^{th}$ column in each $i^{th}$ column group is denoted by $D_i$, if positions of rows with 1 are assumed to be $R_{i,0}^{(1)}, R_{i,0}^{(2)}, \ldots, R_{i,0}^{(D_i)}$, positions $R_{i,j}^{(k)}$ ($k=1, 2, \ldots, D_i$) of rows with 1 are defined as shown in Equation (2), in a $j^{th}$ row (where $j=1, 2, \ldots, M_1-1$) in an $i^{th}$ column group.

$$R_{i,j}^{(k)} = R_{i,(j-1)}^{(k)} + q \bmod(N_1-K_1), \quad (2)$$

$k=1, 2, \ldots, D_i, i=1, \ldots, K_1/M_1, j=1, \ldots, M_1-1$

According to the above rules, it can be appreciated that degrees of columns belonging to an $i^{th}$ column group are all equal to $D_i$. For a better understanding of a structure of a DVB-S2 LDPC code that stores information on the parity-check matrix according to the above rules, the following detailed example will be described.

As a detailed example, for $N_1=30, K_1=15, M_1=5$, and $q=3$, three sequences for information on the positions of rows with 1 for $0^{th}$ columns in 3 column groups can be expressed as follows. Herein, these sequences are called "weight-1 position sequences."

$R_{1,0}^{(1)}=0, R_{1,0}^{(2)}=1, R_{1,0}^{(3)}=2,$ $R_{2,0}^{(1)}=0, R_{2,0}^{(2)}=11, R_{2,0}^{(3)}=13,$ $R_{3,0}^{(1)}=0, R_{3,0}^{(2)}=10, R_{3,0}^{(3)}=14.$

Regarding the weight-1 position sequence for $0^{th}$ columns in each column group, only the corresponding position sequences can be expressed as follows for each column group. For example:

0 1 2
0 11 13
0 10 14.

In other words, the $i^{th}$ weight-1 position sequence in the $i^{th}$ line sequentially represents information on the positions of rows with 1 in the $i^{th}$ column group.

It is possible to generate an LDPC code having the same concept as that of a DVB-S2 LDPC code in FIG. 4, by forming a parity-check matrix using the information corresponding to the detailed example, and Rules 1 and 2.

It is known that the DVB-S2 LDPC code designed in accordance with Rules 1 and 2 can be efficiently encoded using the structural shape. Respective steps in a process of performing LDPC encoding using the DVB-S2 based parity-check matrix will be described below by way of example.

In the following description, as a detailed example, a DVB-S2 LDPC code with $N_1=16200, K_1=10800, M_1=360$, and $q=15$ undergoes an encoding process. For convenience, information bits having a length $K_1$ are represented as $(i_0, i_1, \ldots, i_{K_1-1})$, and parity bits having a length $(N_1-K_1)$ are expressed as $(p_0, p_1, \ldots, p_{N_1-K_1-1})$.

Step 1: An LDPC encoder initializes parity bits as follows:

$p_0=p_1=\ldots=p_{N_1-K_1-1}=0$

Step 2: The LDPC encoder reads information on rows where 1 is located in a column group from a $0^{th}$ weight-1 position sequence out of the stored sequences indicating the parity-check matrix.

0 2084 1613 1548 1286 1460 3196 4297 2481 3369 3451 4620 2622

$R_{1,0}^{(1)}=0, R_{1,0}^{(2)}=2048, R_{1,0}^{(3)}=1613, R_{1,0}^{(4)}=1548,$
$R_{1,0}^{(5)}=1286,$ $R_{1,0}^{(6)}=1460, R_{1,0}^{(7)}=3196, R_{1,0}^{(8)}=4297,$
$R_{1,0}^{(9)}=2481, R_{1,0}^{(10)}=3369,$ $R_{1,0}^{(11)}=3451, R_{1,0}^{(12)}=4620, R_{1,0}^{(13)}=2622.$

The LDPC encoder updates particular parity bits $p_x$ in accordance with Equation (3), using the read information and the first information bit $i_0$. Herein, x is a value of $R_{1,0}^{(k)}$ for $k=1, 2, \ldots, 13$.

$p_0=p_0 \oplus i_0, p_{2084}=p_{2064} \oplus i_0, p_{1613}=p_{1613} \oplus i_0,$ $p_{1548}=p_{1548} \oplus i_0, p_{1286}=p_{1286} \oplus i_0, p_{1460}=p_{1460} \oplus i_0,$ $p_{3196}=p_{3196} \oplus i_0, p_{4297}=p_{4297} \oplus i_0, p_{2481}=p_{2481} \oplus i_0,$ $p_{3369}=p_{3369} \oplus i_0, p_{3451}=p_{3451} \oplus i_0, p_{4620}=p_{4620} \oplus i_0,$ $p_{2622}=p_{2622} \oplus i_0$ \hfill (3)

In Equation (3), $p_x=p_x \oplus i_0$ can also be expressed as $p_x \leftarrow p_x \oplus i_0$, and $\oplus$ represents binary addition.

Step 3: The LDPC encoder first determines a value of Equation (4) for the next 359 information bits $i_m$ (where $m=1, 2, \ldots, 359$) after $i_0$.

$\{x+(m \bmod M_1) \times q\} \bmod(N_1-K_1), M_1=360,$
$m=1,2,\ldots,359$ \hfill (4)

In Equation (4), x is a value of $R_{1,0}^{(k)}$ for $k=1, 2, \ldots, 13$. It should be noted that Equation (4) is similar to Equation (2).

Next, the LDPC encoder performs an operation similar to Equation (3) using the values found in Equation (4). In other words, the LDPC encoder updates parity bits $p_{\{x+(m \bmod M_1) \times q\} \bmod(N_1-K_1)}$ for $i_m$. For example, for $m=1$, i.e. for $i_1$, the LDPC encoder updates parity bits $p_{(x+q) \bmod(N_1-K_1)}$ as defined in Equation (5).

$p_{15}=p_{15} \oplus i_1, p_{2099}=p_{2099} \oplus i_1, p_{1628}=p_{1628} \oplus i_1,$ $p_{1563}=p_{1563} \oplus i_1, p_{1301}=p_{1301} \oplus i_1, p_{1475}=p_{1475} \oplus i_1,$ $p_{3211}=p_{3211} \oplus i_1, p_{4312}=p_{4312} \oplus i_1, p_{2496}=p_{2496} \oplus i_1,$ $p_{3384}=p_{3384} \oplus i_1, p_{3466}=p_{3466} \oplus i_1, p_{4635}=p_{4635} \oplus i_1,$ $p_{2637}=p_{2637} \oplus i_1$ \hfill (5)

It is to be noted that q=15 in Equation (5). The LDPC encoder performs the above process for m=1, 2, ..., 359, in the same manner as shown above.

Step 4: As in Step 2, the LDPC encoder reads information of the $1^{st}$ weight-1 position sequence $R_{2,0}^{(k)}$ (k=1, 2, ..., 13) for a $361^{st}$ information bit $i_{360}$, and updates particular parity bits $p_x$, where x is $R_{2,0}^{(k)}$. The LDPC encoder updates $p_{\{x+(m \, mod \, M_1) \times q\} \, mod(N_1-K_1)}$, m=361, 362, ..., 719 by similarly applying Equation (4) to the next 359 information bits $i_{361}$, $i_{362}$, ..., $i_{719}$ after $i_{360}$.

Step 5: The LDPC encoder repeats Steps 2, 3, and 4 for all groups each having 360 information bits.

Step 6: The LDPC encoder finally determines parity bits using Equation (6).

$$p_i = p_i \oplus p_{i-1}, \, i=1,2,\ldots,N_1-K_1-1 \quad (6)$$

The parity bits $p_i$ of Equation (6) are parity bits that have completely undergone LDPC encoding.

As described above, DVB-S2 carries out encoding through the process of Steps 1 to 6.

In order to apply the LDPC code to the actual communication system, the LDPC code should be designed to be suitable for the data rate required in the communication system. Particularly, not only in an adaptive communication system employing Hybrid Automatic Retransmission reQuest (HARQ) and Adaptive Modulation and Coding (AMC), but also in a communication system supporting various broadcast services, LDPC codes having various codeword lengths are needed to support various data rates according to the system requirements.

However, as described above, the LDPC code used in the DVB-S2 system has only two types of codeword lengths due to its limited use, and each type of the LDPC code needs an independent parity-check matrix. For these reasons, there is a long-felt need in the art for a method for supporting various codeword lengths to increase extendibility and flexibility of the system. Particularly, in the DVB-S2 system, transmission of data having several hundreds to thousands of bits is needed for transmission of signaling information. However, because only 16200 and 64800 are available for lengths of the DVB-S2 LDPC code, there is a still a need for support of various codeword lengths. Yet, since storing independent parity-check matrixes for respective codeword lengths of the LDPC code may reduce memory efficiency, there is a need for a scheme capable of efficiently supporting various codeword lengths from the given existing parity-check matrix, without designing a new parity-check matrix.

SUMMARY OF THE INVENTION

An aspect of an embodiment of the present invention is to address at least the above-mentioned problems and/or disadvantages and to provide at least the advantages described below. Accordingly, an aspect of the present invention is to provide a channel encoding/decoding method and apparatus for generating, from a given LDPC code, an LDPC code with a different codeword length using shortening or puncturing determined by considering high-order modulation in a communication system using LDPC codes.

Another aspect of an embodiment of the present invention is to provide a channel encoding/decoding method and apparatus for guaranteeing optimal performance considering a DVB-S2 structure in a communication system using LDPC codes.

In accordance with one aspect of the present invention, a method for encoding a channel in a communication system using a Low-Density Parity-Check (LDPC) code is provided. The method includes determining a number of parity bits for puncturing; dividing the parity bits at predetermined intervals, and determining a number of puncturing parity bits, which are subjected to puncturing within the predetermined intervals; determining a modulation scheme; determining positions of puncturing parity bits corresponding to the determined number of the puncturing parity bits within the predetermined intervals according to the modulation scheme; repeatedly performing puncturing on puncturing parity bits corresponding to the determined positions at the predetermined intervals; and transmitting remaining bits except for the punctured bits according to the modulation scheme.

In accordance with another aspect of the present invention, an apparatus for encoding a channel in a communication system using a Low-Density Parity-Check (LDPC) code is provided. The apparatus includes a puncturing pattern applier for determining a number of parity bits for puncturing, dividing the parity bits at predetermined intervals, determining a number of puncturing parity bits, which are subjected to puncturing within the predetermined intervals, determining a modulation scheme, determining positions of puncturing parity bits corresponding to the determined number of the puncturing parity bits within the predetermined intervals according to the modulation scheme, and repeatedly performing puncturing on puncturing parity bits corresponding to the determined positions at the predetermined intervals; and a transmitter for transmitting remaining bits except for the punctured bits according to the modulation scheme.

In accordance with further another aspect of the present invention, a method for decoding a channel in a communication system using a Low-Density Parity-Check (LDPC) code is provided. The method includes demodulating a signal transmitted from a transmitter; determining whether there are any punctured parity bits in the demodulated signal; determining positions of the punctured parity bits by estimating information about a puncturing pattern when there are punctured parity bits; and decoding data using the positions of the punctured parity bits. The information about the puncturing pattern includes a puncturing pattern obtained by considering a modulation scheme determined by the transmitter.

In accordance with further another aspect of the present invention, an apparatus for decoding a channel in a communication system using a Low-Density Parity-Check (LDPC) code is provided. The apparatus includes a demodulator for demodulating a signal transmitted from a transmitter; a puncturing pattern estimator for determining whether there are any punctured parity bits in the demodulated signal, and determining positions of the punctured parity bits by estimating information about a puncturing pattern when there are punctured parity bits; and a decoder for decoding data using the positions of the punctured parity bits. The information about the puncturing pattern includes a puncturing pattern obtained by considering a modulation scheme determined by the transmitter.

Other aspects, advantages, and salient features of the invention will become apparent to those skilled in the art from the following detailed description, which, taken in conjunction with the annexed drawings, discloses embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which:

FIG. 4 illustrates an example of a parity-check matrix of a DVB-S2 LDPC code;

Throughout the drawings, the same drawing reference numerals will be understood to refer to the same elements, features and structures.

DETAILED DESCRIPTION OF EXEMPLARY EMBODIMENTS

The following description with reference to the accompanying drawings is provided to assist in a comprehensive understanding of embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Reliability difference in high-order modulation will first be described before a description of the present invention. Attention should be paid in designing an LDPC code because reliabilities of bits constituting high-order modulation symbols are different when high-order modulation is used in the communication system requiring LDPC codes with various codeword lengths, unlike in the communication system employing only Binary Phase Shift Keying (BPSK) or Quadrature Phase Shift Keying (QPSK).

In order to explain the reliability difference in high-order modulation, a description of signal constellations for Quadrature Amplitude Modulation (QAM) which is high-order modulation commonly used in communication systems will be provided. A QAM-modulated symbol consists of a real part and an imaginary part, and various modulation symbols may be generated by differentiating magnitudes and signs of their real parts and imaginary parts. QAM will be described together with QPSK modulation to consider the details of QAM characteristics.

Figure 5A:
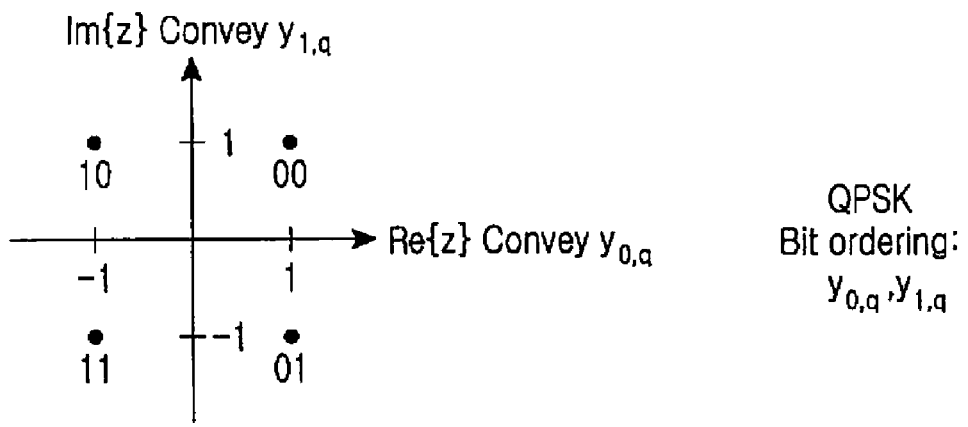
FIG. 5A illustrates a signal constellation for QPSK modulation used in a digital communication system.

FIG. 5A illustrates a signal constellation for general QPSK modulation.

Referring to FIG. 5A, $y_0$ determines a sign of a real part while $y_1$ determines a sign of an imaginary part. That is, a sign of the real part is plus (+) for $y_0=0$, and minus (−) for $y_0=1$. Also, a sign of the imaginary part is plus (+) for $y_1=0$, and minus (−) for $y_1=1$. Since $y_0$ and $y_1$ are equal in error occurrence probability as they are sign indication bits that indicate respective signs of the real part and the imaginary part, reliabilities of ($y_0$, $y_1$) bits corresponding to one modulation signal are equally important, in QPSK modulation. For $y_{0,q}$ and $y_{1,q}$, the second subscript index 'q' indicates $q^{th}$ outputs of bits constituting a modulation signal.

Figure 5B:
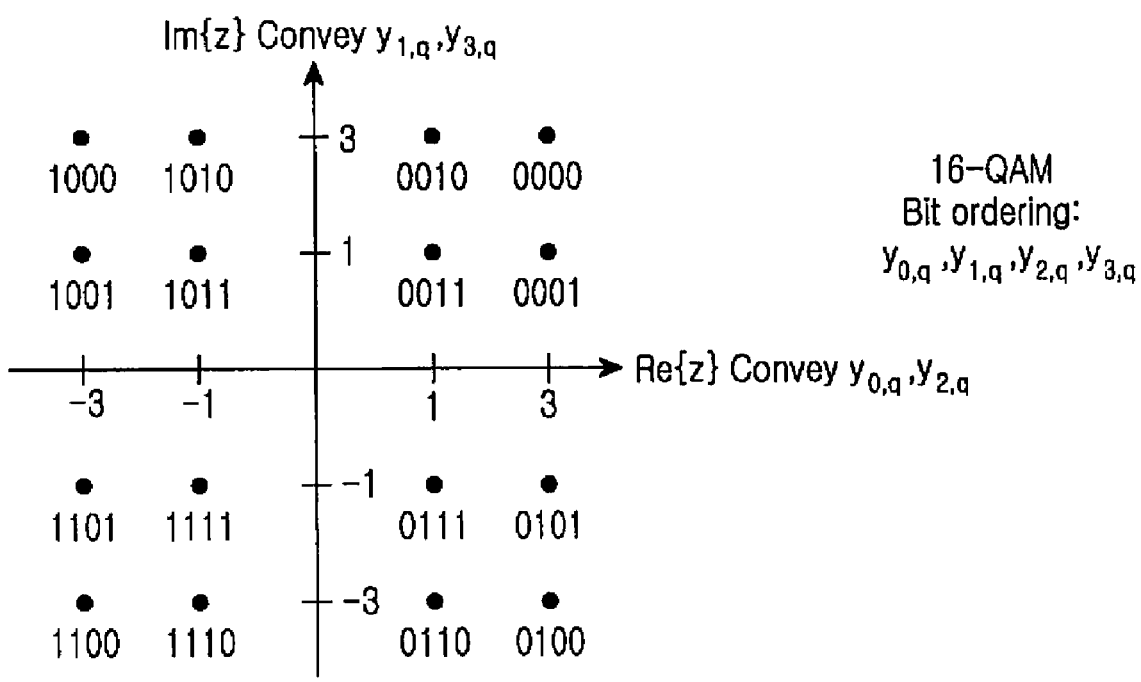
FIG. 5B illustrates a signal constellation for 16QAM modulation used in a digital communication system.

FIG. 5B illustrates a signal constellation for general 16QAM modulation.

Referring to FIG. 5B, the meaning of ($y_0$, $y_1$, $y_2$, $y_3$), corresponding to bits of one modulation signal, is as follows. Bits $y_0$ and $y_2$ determine a sign and a magnitude of the real part, respectively, while bits $y_1$ and $y_3$ determine a sign and a magnitude of the imaginary part, respectively. In other words, $y_0$ and $y_1$ determine signs of the real part and imaginary part of the modulation signal, while $y_2$ and $y_3$ determine magnitudes of the real part and imaginary part of the modulation signal. Because distinguishing a sign of a modulated signal is easier than distinguishing a magnitude of the modulated signal, $y_2$ and $y_3$ are higher than $y_0$ and $y_1$ in error occurrence probability. Therefore, in terms of non-error occurrence probabilities (i.e. reliabilities) of the bits, $y_0=y_1>y_2=y_3$. That is, bits ($y_0$, $y_1$, $y_2$, $y_3$) constituting a QAM modulation signal, unlike those of a QPSK modulation signal, have different reliabilities.

In 16QAM modulation, among the 4 bits constituting a signal, 2 bits determine signs of the real part and imaginary part of the signal and the remaining bits only need to determine magnitudes of the real part and imaginary part of the signal. Thus, orders of ($y_0$, $y_1$, $y_2$, $y_3$) and a role of each bit are subject to change.

Figure 5C:
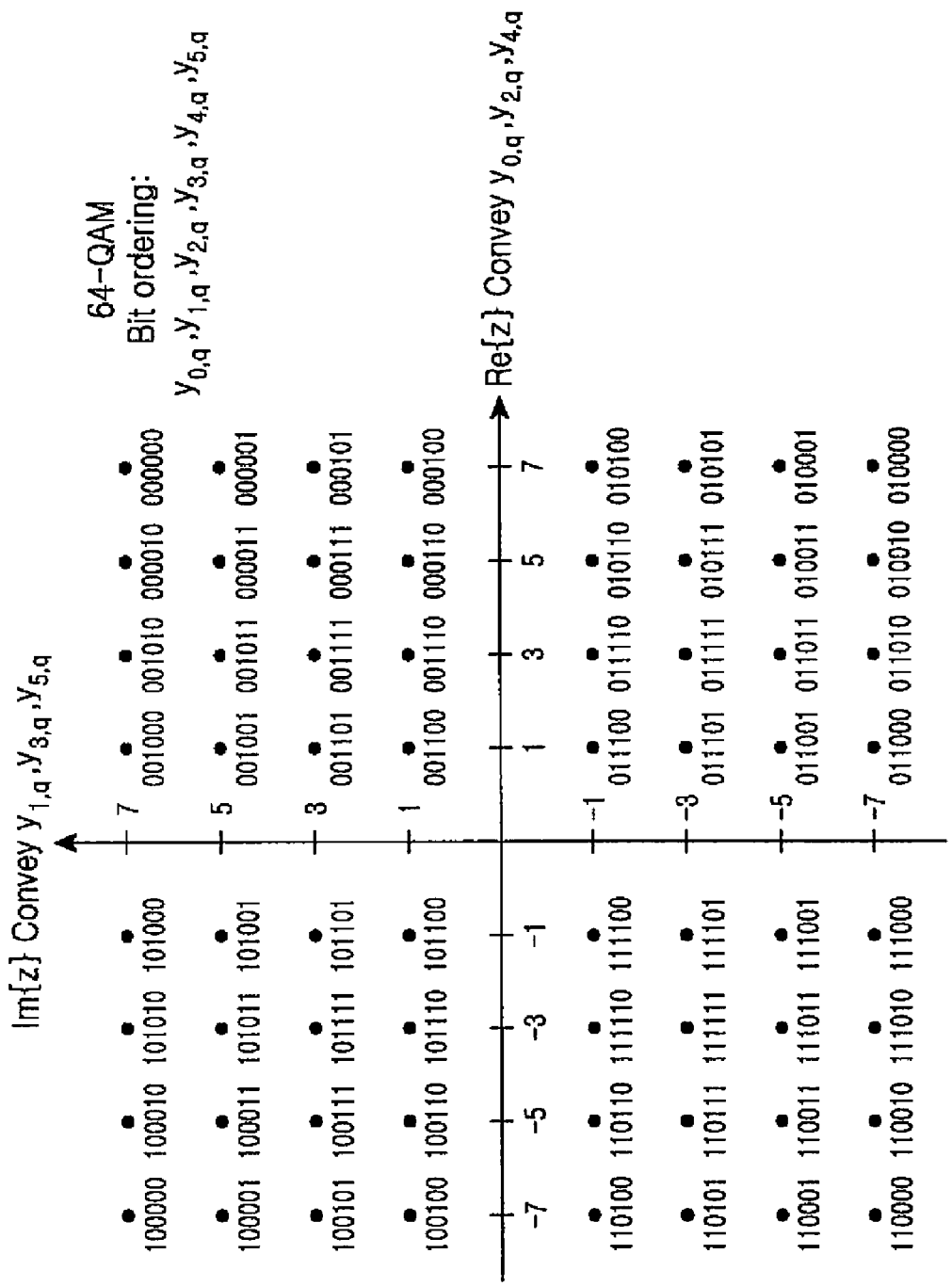
FIG. 5C illustrates a signal constellation for 64QAM modulation used in a digital communication system.

FIG. 5C illustrates a signal constellation for general 64QAM modulation.

Of ($y_0$, $y_1$, $y_2$, $y_3$, $y_4$, $y_5$), corresponding to the bits of one modulation signal, bits $y_0$, $y_2$ and $y_4$ determine a magnitude and a sign of the real part, and $y_1$, $y_3$ and $y_5$ determine a magnitude and a sign of the imaginary part. Here, $y_0$ and $y_1$ determine signs of the real part and the imaginary part, respectively, and a combination of $y_2$ and $y_4$ and a combination of $y_3$ and $y_5$ determine magnitudes of the real part and the imaginary part, respectively. Because distinguishing signs of a modulated signal are easier than distinguishing magnitudes of the modulated signal, reliabilities of $y_0$ and $y_1$ are higher than reliabilities of $y_2$, $y_3$, $y_4$, and $y_5$. The bits $y_2$ and $y_3$ are determined depending on whether a magnitude of the modulated symbol is greater or less than 4, and the bits $y_4$ and $y_5$ are determined according to whether the magnitude of the modulated symbol is closer to 4 or 0 with 2 centered there between, or closer to 4 or 8 with 6 centered there between. Thus, a range in which the magnitude is determined by $y_2$ and $y_3$ is 4, while a range for $y_4$ and $y_5$ is 2. As a result, $y_2$ and $y_3$ are higher than $y_4$ and $y_5$ in reliability. In conclusion, $y_0 = y_1 > y_2 = y_3 > y_4 = y_5$ in terms of non-error occurrence probabilities (i.e. reliabilities) of the bits.

In 64QAM modulation, of the 6 bits constituting a signal, 2 bits determine signs of the real part and imaginary part of the signal, and 4 bits only need to determine magnitudes of the real part and imaginary part of the signal. Accordingly, orders of ($y_0$, $y_1$, $y_2$, $y_3$, $y_4$, $y_5$) and a role of each bit are subject to change. Also, in a signal constellation of 256QAM or higher, the roles and reliabilities of bits constituting a modulation signal are different as described above. A detailed description thereof will be omitted.

Therefore, the present invention provides a method and apparatus for supporting LDPC codes with various codeword lengths suitable for high-order modulation, using a parity-check matrix of a structured LDPC code in a particular form. In addition, the present invention provides an apparatus for supporting various codeword lengths according to high-order modulation in a communication system using an LDPC code in a particular form, and a method for controlling the same. In particular, the present invention provides a method for generating an LDPC code using a parity-check matrix of a given LDPC code, the generated LDPC code being less than the given LDPC code, and an apparatus thereof.

Figure 6:
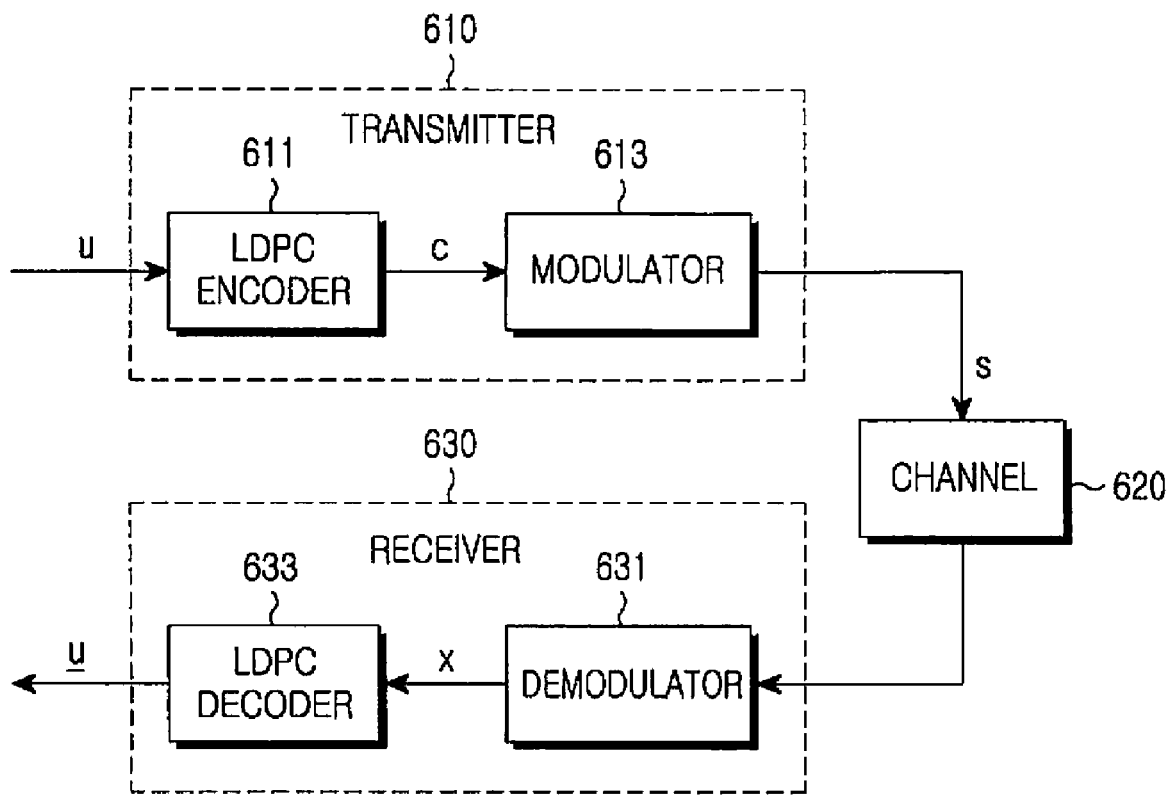
FIG. 6 is a block diagram of a transceiver in a communication system using an LDPC code.

FIG. 6 is a block diagram of a transceiver in a communication system using an LDPC code.

Referring to FIG. 6, a message u is input to an LDPC encoder 611 in a transmitter 610 before being transmitted to a receiver 630. The LDPC encoder 611 encodes the input message u, and outputs the encoded signal c to a modulator 613. The modulator 613 modulates the encoded signal c, and transmits the modulated signal s to the receiver 630 over a wireless channel 620. A demodulator 631 in the receiver 630 demodulates the received signal r, and outputs the demodulated signal x to an LDPC decoder 633. The LDPC decoder 633 finds an estimate u of the message based on the data received through the wireless channel 620 by decoding the demodulated signal x.

The LDPC encoder 611 generates a parity-check matrix according to a codeword length required by a communication system, using a preset scheme. Particularly, in accordance with an embodiment of the present invention, the LDPC encoder 611 may support various codeword lengths using the LDPC code without the separate need for additional stored information.

In accordance with an embodiment of the present invention, a method of acquiring various codeword lengths from a given LDPC code uses shortening or puncturing. The term "puncturing" as used herein indicates a method that does not transmit a specified part of an LDPC codeword after generating the LDPC codeword from a given particular parity-check matrix by performing LDPC encoding. Hence, a receiver determines that the non-transmitted bits were erased.

For a better understanding of the puncturing, a parity-check matrix of the DVB-S2 LDPC code illustrated in FIG. 3 will be described in more detail below.

Figures 1, 2:
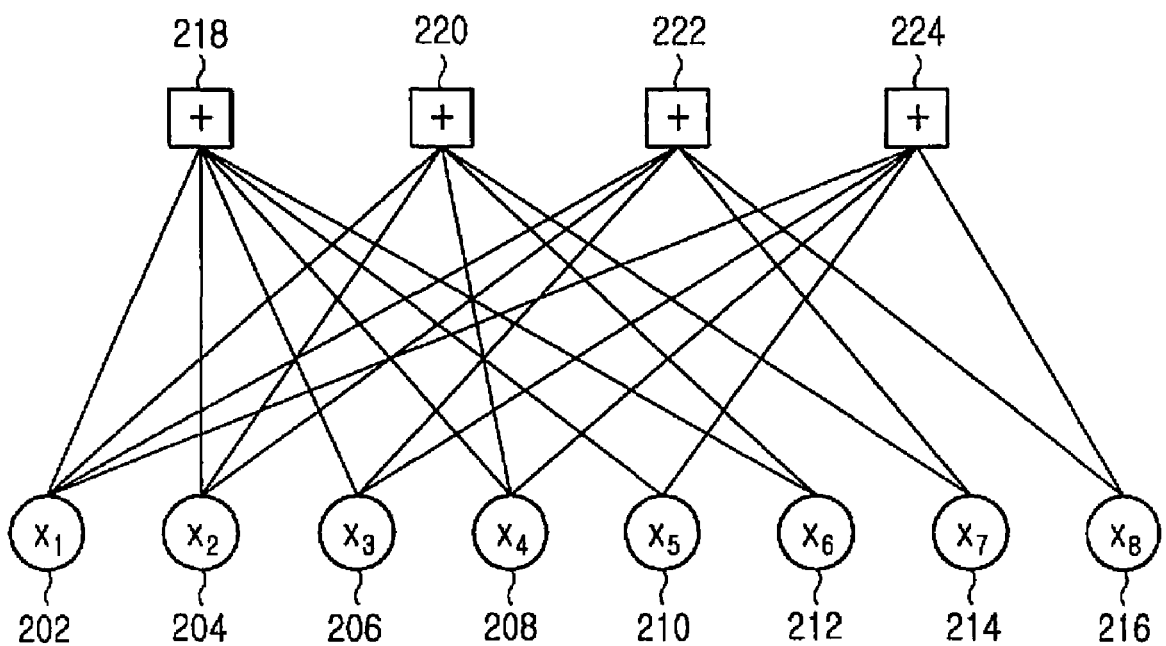
FIG. 1 illustrates an example of a parity-check matrix of a length-8 LDPC code.
FIG. 2 illustrates a Tanner graph for a parity-check matrix of a length-8 LDPC code.
Figure 3:
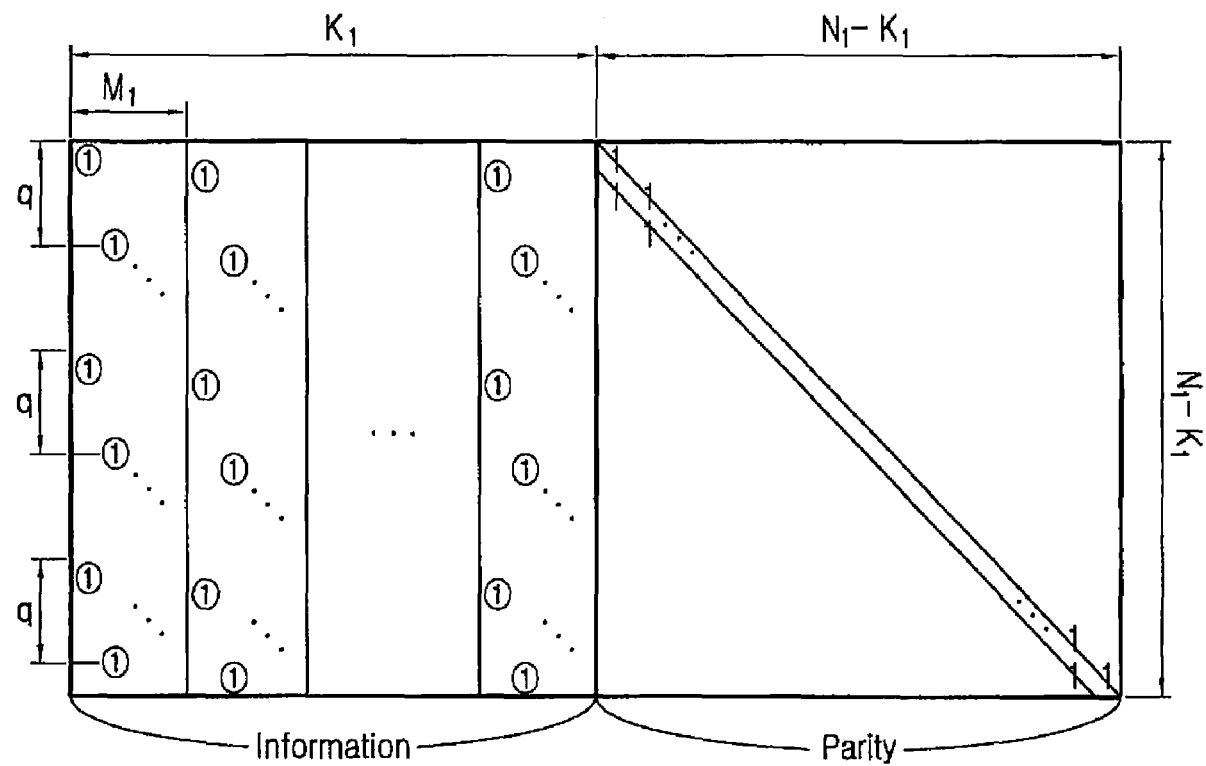
FIG. 3 illustrates a DVB-S2 LDPC code.

Regarding the parity-check matrix of the DVB-S2 LDPC code illustrated in FIG. 3, its total length is $N_1$, $K_1$ columns in the leading part of the parity-check matrix correspond to information bits ($i_0$, $i_1$, . . . , $i_{K_1-1}$), and columns in the remaining rear part correspond to length-($N_1-K_1$) parity bits ($p_0$, $p_1$, . . . , $p_{N_1-K_1-1}$).

Generally, the puncturing can be applied to both the information bits and the parity bits. Although the puncturing and the shortening commonly reduce codeword lengths, the puncturing, unlike the shortening, described herein above, does not limit values of particular bits. The puncturing is a method for simply not transmitting particular information bits or particular parts of generated parity bits, so that a receiver can erase the corresponding bits. In other words, by simply not transmitting bits in $N_p$ predefined positions in a generated length-$N_1$ LDPC codeword, the puncturing can obtain the same effect as that obtained by transmitting a length-($N_1-N_p$) LDPC codeword. Because columns corresponding to the bits punctured in the parity-check matrix are all used intact in a decoding process, with the columns erased, the puncturing is distinct from the shortening.

Further, because position information for the punctured bits can be shared or estimated in common by the transmitter and the receiver when the system is set up, the receiver may merely erase the corresponding punctured bits, before decoding.

In the puncturing technique, because a length of a codeword that the transmitter actually transmits is $N_1-N_p$ and a length of an information word is constantly $K_1$, the code rate becomes $K_1/(N_1-N_p)$, which is always greater than the first given code rate $K_1/N_1$.

A description will now be made of a shortening technique and a puncturing technique suitable for the DVB-S2 LDPC code. The DVB-S2 LDPC code, as described above, is an LDPC code having a particular structure. Therefore, compared with the normal LDPC code, the DVB-S2 LDPC code is able to undergo more efficient shortening and puncturing.

Figure 4:
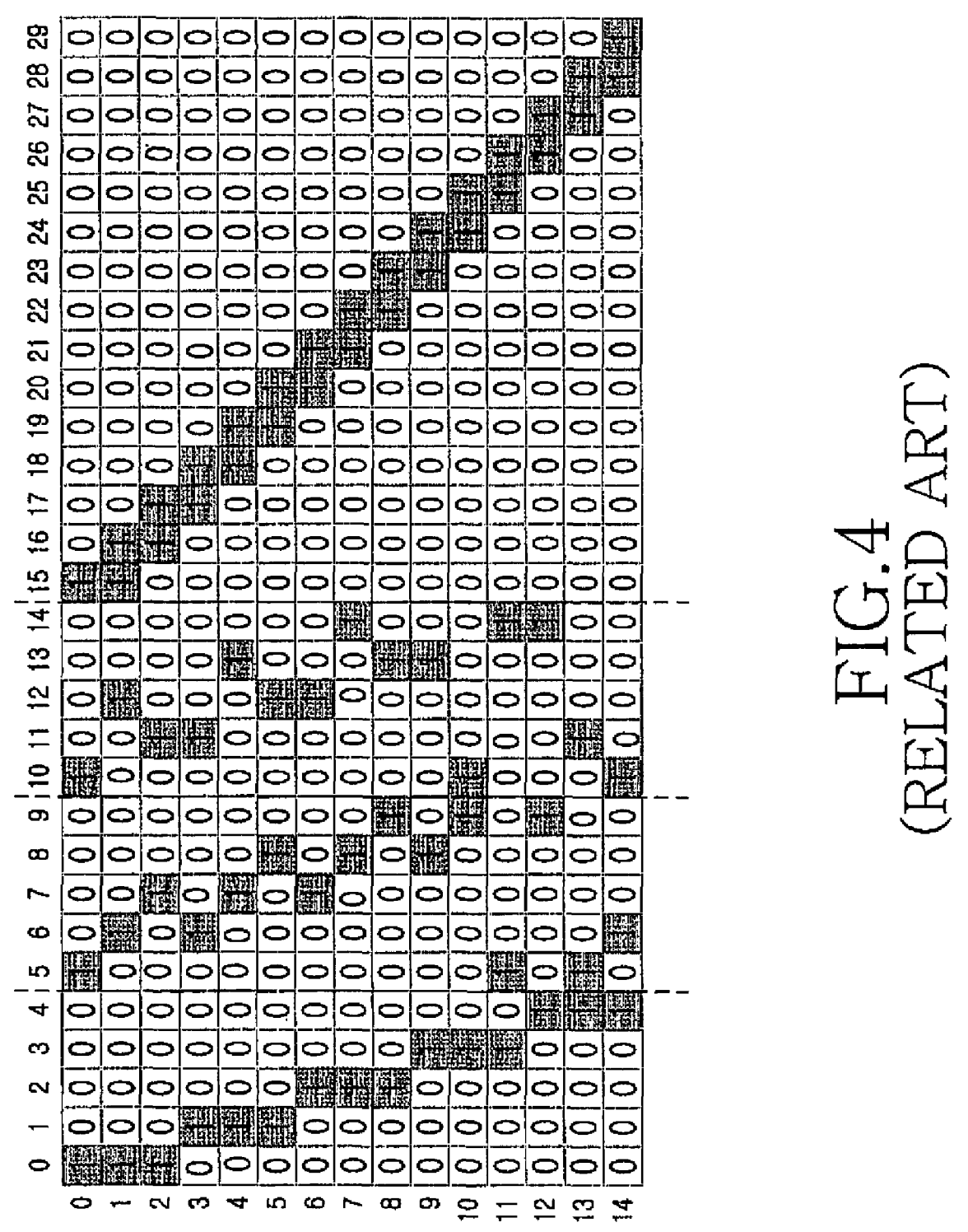

With reference to FIG. 4, a detailed description will be made of characteristics of a DVB-S2 LDPC code to which parity puncturing is applied. It is to be noted that for the DVB-S2 LDPC code of FIG. 4, $N_1=30$, $K_1=15$, $M_1=5$, and q=3, and weight-1 position sequences for $0^{th}$ columns in three column groups are as follows:

0 1 2
0 11 13
0 10 14

An $i^{th}$ weight-1 position sequence in an $i^{th}$ column sequentially represents information on the positions of rows with 1 in an $i^{th}$ column group.

Figure 7:
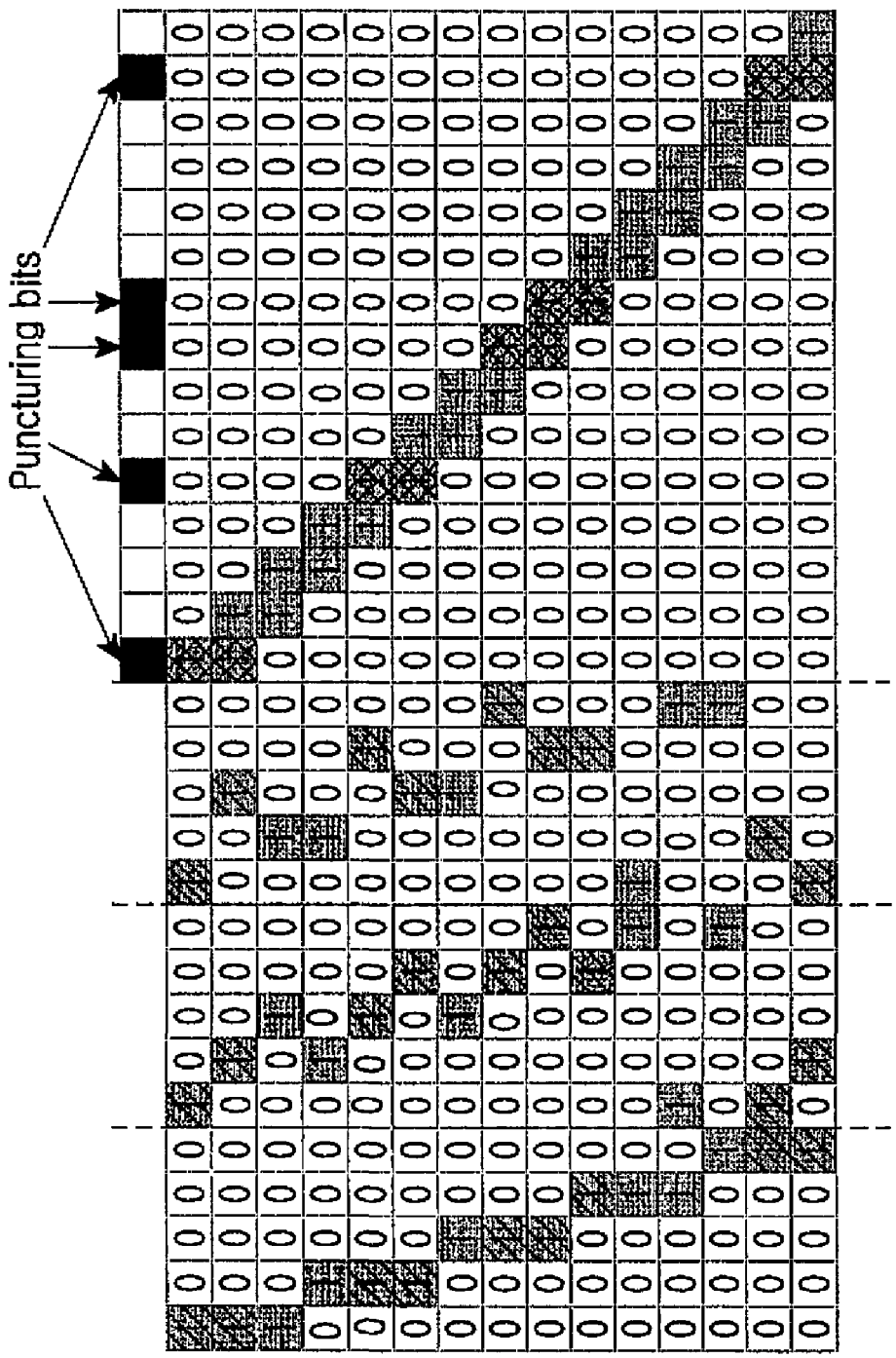
FIG. 7 illustrates an example where random puncturing is applied to the LDPC code of FIG. 4.

FIG. 7 illustrates an example where random puncturing is applied to the LDPC code of FIG. 4. Because the parity bits punctured in FIG. 7 are subjected to erasure processing at a decoder, the punctured parity bits, compared with the other non-erased bits, are not greater in a performance improvement effect in an LDPC decoding process, so their reliabilities decrease. Consequently, the other bits directly connected to the punctured parity bits, which are low in reliability, also suffer from a decrease in the performance improvement effect in the decoding process. The decrease in the performance improvement effect increases as the number of edges directly connected to the bits punctured on the Tanner graph increases.

In FIG. 7, for example, a $0^{th}$ information bit corresponding to a $0^{th}$ column is directly connected to the punctured parity bit twice, a $3^{rd}$ information bit corresponding to a $3^{rd}$ column is directly connected to the punctured parity bit once, and an $8^{th}$ information bit corresponding to an $8^{th}$ column is directly connected to the punctured parity bit three times. In this case, the $3^{rd}$, $0^{th}$, and $8^{th}$ information bits are superior in the performance improvement effect in order in the decoding process. In other words, when the degrees of the variable nodes are equal to each other, the performance improvement effect decreases as the number of the connected punctured bits increases.

It can be appreciated from FIG. 7 that the numbers of punctured parity bits, which are directly connected to respective information bits, are random due to the random puncturing pattern. Therefore, there is a high probability that reliabilities of respective information bits will also be random. In other words, while some information bits may gain higher-than-needed decoding performance, other information bits may suffer significant performance degradation. This random puncturing pattern may lead to considerable irregularity of the reliabilities of the information bits in the decoding process.

Figure 8:
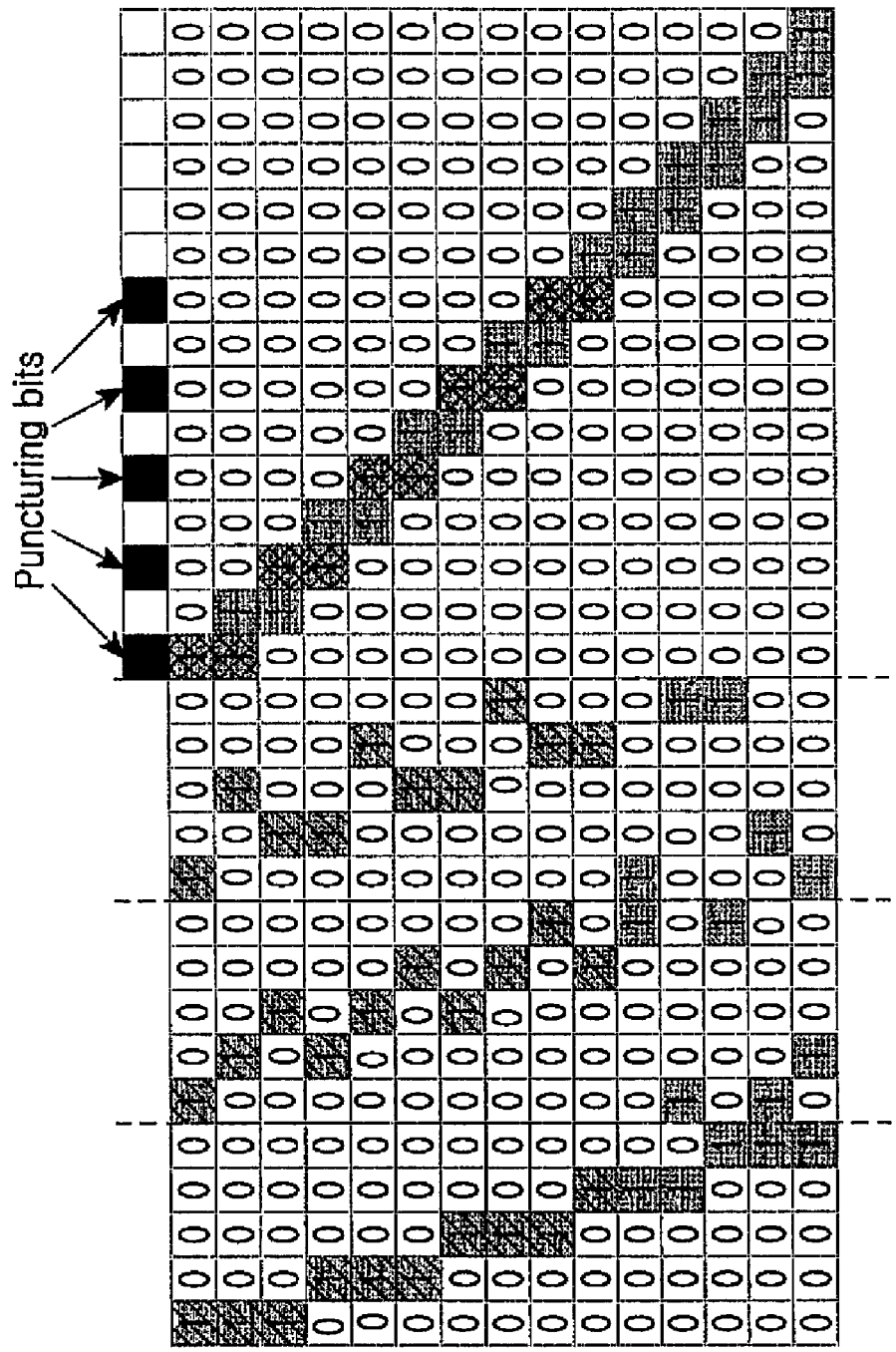
FIG. 8 illustrates another example where non-random puncturing is applied to the LDPC code of FIG. 4.

FIG. 8 illustrates a second example where non-random puncturing is applied to the LDPC code of FIG. 4. More specifically, a relatively non-random puncturing pattern in a particular form is applied in the example illustrated in FIG. 8.

Referring to FIG. 8, even though the relatively non-random puncturing pattern is applied, the connections to the information bits may be significantly irregular according to the corresponding puncturing pattern. The non-random puncturing pattern of FIG. 8 may be more irregular compared with the random puncturing pattern of FIG. 7.

In case of the LDPC code with a parity-check matrix having a particular structure like the DVB-S2 LDPC code, the connections between the information bits and the parity bits punctured according to the puncturing pattern can be significantly changed.

The embodiments of the present invention suggest a puncturing pattern that provides stable decoding performance by maximally suppressing the irregularity of the reliabilities of the information bits in the decoding process using the structural characteristics of the DVB-S2 LDPC code.

Figure 9:
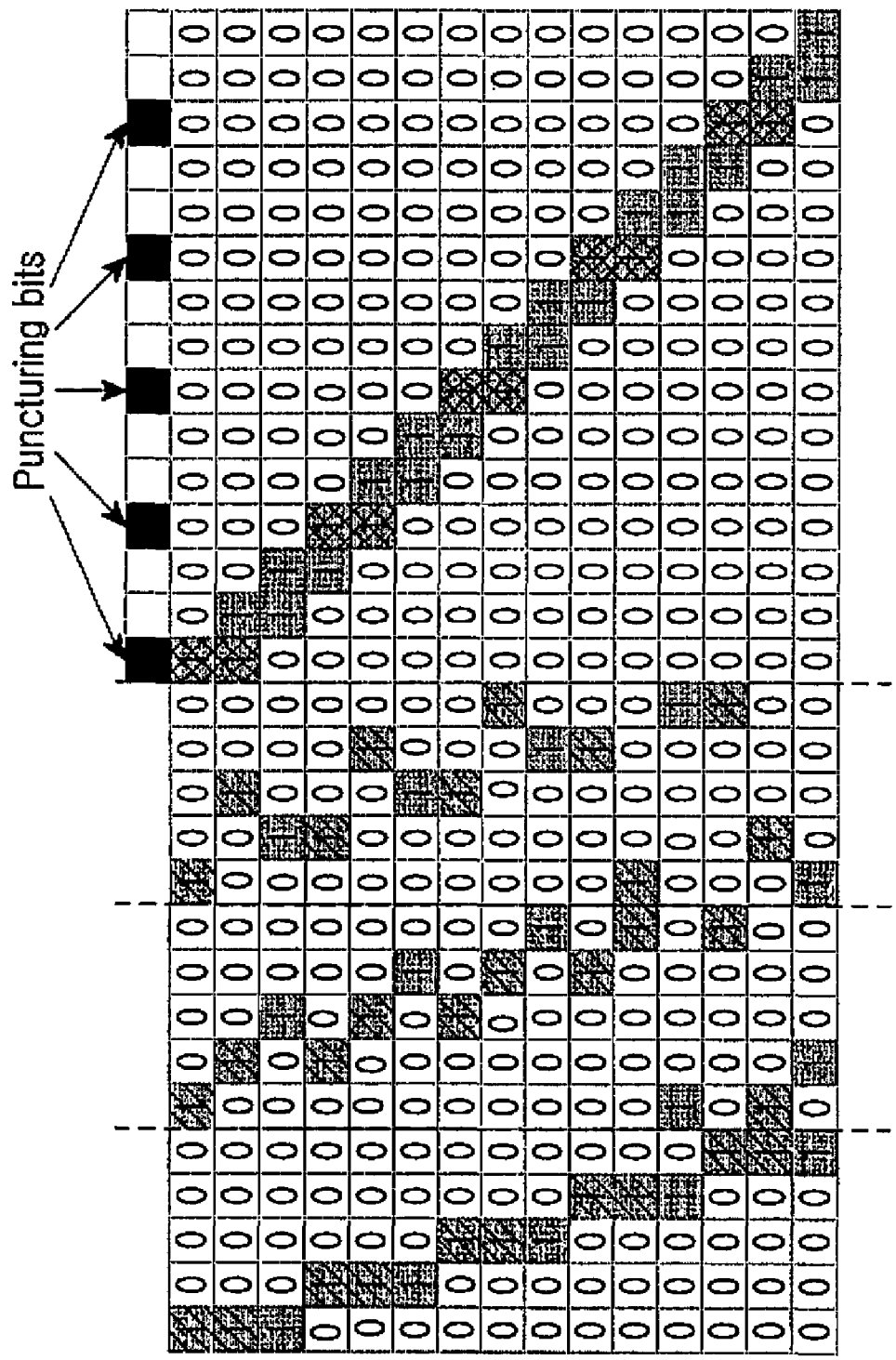
FIG. 9 illustrates another example where non-random puncturing is applied to the LDPC code of FIG. 4.

FIG. 9 illustrates a third example where non-random puncturing is applied to the LDPC code of FIG. 4. In the example of FIG. 9, a puncturing pattern that maintains a constant interval of 3 between punctured parity bits from q=3, which is one of the constituent variables, is applied to the parity-check matrix illustrated in FIG. 4. As can be seen in FIG. 9, each of the information bits is equally and twice connected to the punctured bit.

The irregularity between the punctured bits and information bits is remarkably reduced when the interval between the punctured parity bits is set according to the value of q due to the structure of the DVB-S2 LDPC code. This is better described with reference to FIG. 3.

Referring to Rules 1 and 2 and FIG. 3, regarding each column group, positions of '1's in the first column in the corresponding column group determine positions of '1's in the remaining columns. Indexes of rows where 1 is located in the remaining columns differ exactly by a multiple of q from an index of a row where 1 is located in the first column, in regard to modulo $(N_1-K_1)$, where $N_1$ denotes a length of an LDPC codeword and $K_1$ indicates a length of an information word. More specifically, indexes of rows where 1 is located in two consecutive columns in a particular column group differ from each other exactly by q, for modulo $(N_1-K_1)$.

Another characteristic of the DVB-S2 LDPC code lies in a submatrix corresponding to the parity part in the parity-check matrix. Referring to FIG. 3, the parity part has a structure of a lower triangular matrix in which 1 exists in all of diagonal parts, and in this structure, an $i^{th}$ parity bit corresponds to '1' located in an $i^{th}$ row.

In light of the structural characteristic of the DVB-S2 LDPC code, assuming that particular parity bits are punctured, if parity puncturing is repeated exactly at intervals of q, the number of edges of information bits connected to the parity bits punctured in a particular column group is most regular. For example, assuming that an $i^{th}$ parity bit is punctured for $0 \leq i < q$ and an $(i+kq)^{th}$ parity bit is repeatedly punctured for $0 \leq k < M_1$, if a certain information bit is connected to the $i^{th}$ parity bit, this indicates that '1' exists in an $i^{th}$ row for a column corresponding to the information bit. Therefore, it can be understood that '1' exists in the $(i+kq)^{th}$ row in a column corresponding to an information bit which is separated by k from the above information bit among the columns in a column group according to Rule 1 and Rule 2. As a result, the information bit is connected to the punctured $(i+kq)^{th}$ bit.

For the DVB-S2 LDPC code, because degrees of variable nodes corresponding to the entire information word are equal to each other in one column group, and one or less of '1' is distributed in one row, when q-periodic puncturing is applied, the information bits corresponding to one column group are connected to a same number of punctured bits. Therefore, the connections between the punctured bits and the information bits become regular, so that stabilized decoding can be expected in the decoding process.

As described so far, it can be appreciated that for the DVB-S2 LDPC code, the q-periodic puncturing technique can contribute to performance improvement by making the best use of the structural characteristics of the DVB-S2 LDPC code. However, to date, with regard to the optimized puncturing pattern obtained by considering the q-periodic puncturing, only the results obtained by setting BPSK or QPSK are known.

In addition to the q-periodic puncturing method, there are known methods that optimize the performance according to the code rate or codeword length when applying shortening or puncturing to the general LDPC code. However, because the known existing methods of finding a shortening/puncturing pattern perform the optimization process considering only BPSK or QPSK, only one optimized shortening/puncturing pattern could exist for a given LDPC code.

However, the optimized puncturing/shortening pattern obtained when high-order modulation is used and a signal constellation/bit mapping (bit mapping on the signal constellation) scheme has been determined, may differ from that in BPSK or QPSK modulation.

In BPSK or QPSK modulation, because reliabilities of bits constituting a symbol are equal, reliabilities of codeword bits are also equal in the LDPC codeword after it underwent shortening or puncturing, so there is no need to consider a modulation scheme in the process of finding the shortening/puncturing pattern. However, as described above, in high-order modulation such as 16QAM, 64QAM and 256QAM, because reliabilities of bits constituting a symbol are different, when the high-order modulation scheme and the signal constellation/bit mapping scheme are determined, reliabilities of codeword bits in the LDPC codeword after application of shortening or puncturing may be different from those before application of puncturing or shortening.

Figure 10:
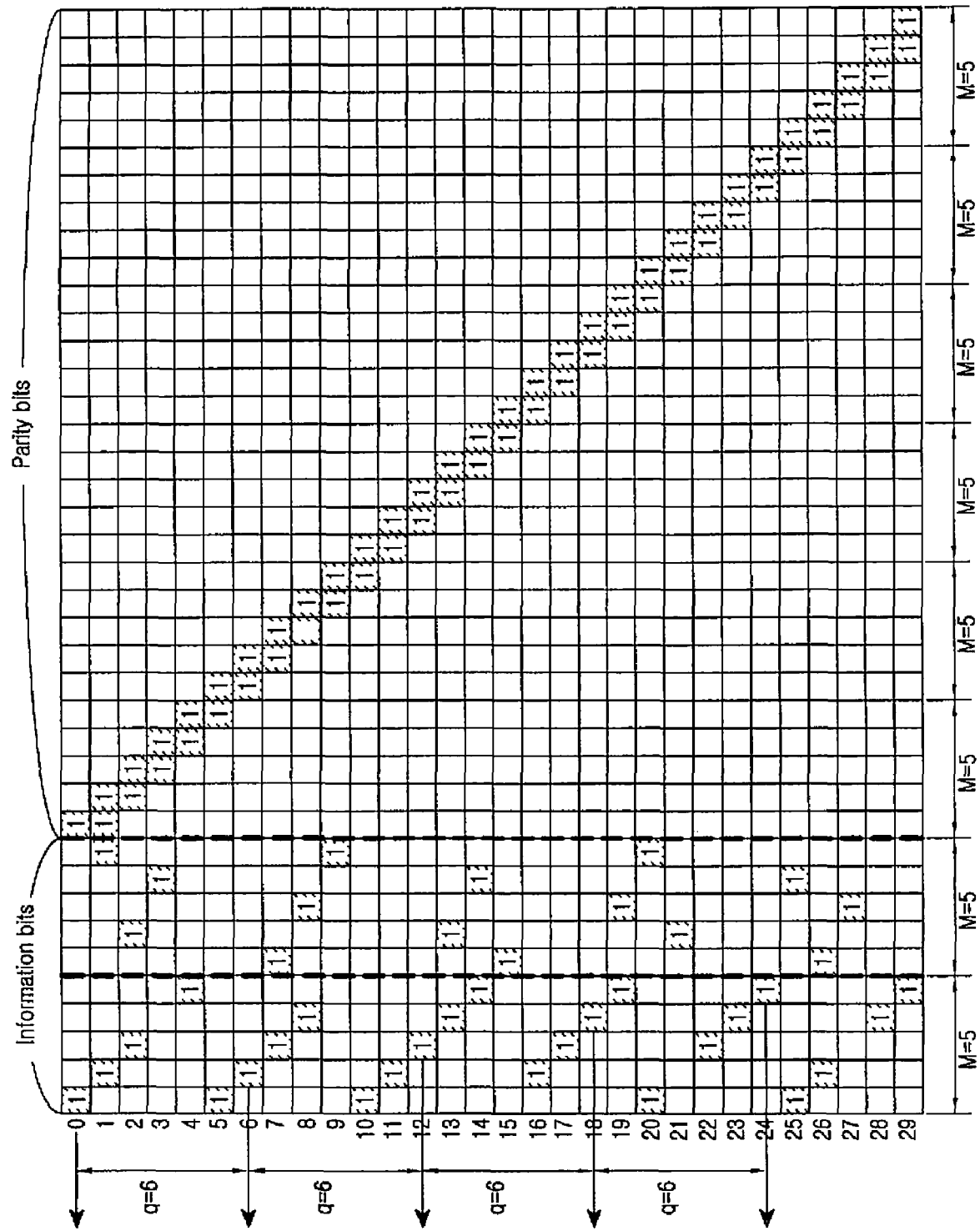
FIG. 10 illustrates another example of a parity-check matrix of a DVB-S2 LDPC code.

FIG. 10 illustrates another example of a parity-check matrix of a DVB-S2 LDPC code.

In FIG. 10, $N_1=40$, $K_1=10$, $M_1=5$, and $q=6$, and weight-1 position sequences for $0^{th}$ columns in two column groups of an information word are as follows:

0 5 10 20 25

7 15 26

An $i^{th}$ weight-1 position sequence in an $i^{th}$ column sequentially represents information on the positions of rows with 1 in an $i^{th}$ column group.

Referring to FIG. 10, a degree of each column corresponding to the first column group is 5, and a degree of each column corresponding to the second column group is 3. Generally, as to an LDPC code, its performance improvement effect is excellent in a decoding process as the degrees increase. Thus, it is commonly expected that performance given after decoding bits corresponding to the first column group would be superior compared to that of the second column group.

Figure 11:
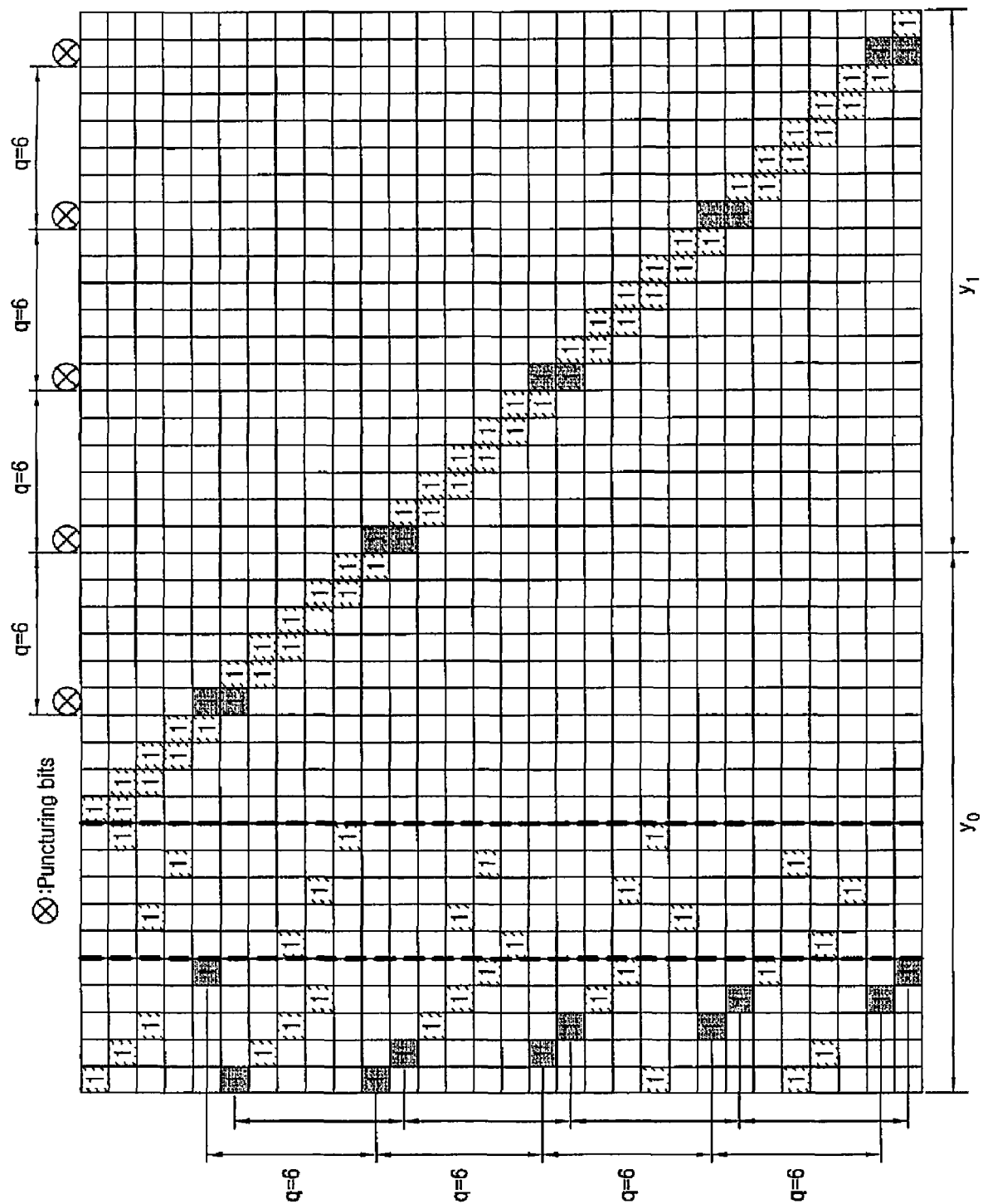
FIG. 11 illustrates an example of a puncturing pattern determined by considering BPSK or QPSK transmission in the LDPC code of FIG. 10.

With reference to FIG. 11, a brief description will now be made of a puncturing pattern which is suitable when BPSK or QPSK modulation is applied to the LDPC code with a parity-check matrix of FIG. 10. In FIG. 11, $y_0$ and $y_1$ indicate each BPSK symbol, or indicate two bits constituting one QPSK symbol. Hence, $y_0$ and $y_1$ are equal in reliability on the signal constellation.

Referring to FIG. 11, after a parity bit corresponding to a $5^{th}$ column in a submatrix corresponding to an arbitrary parity bit is punctured, one parity bit is punctured four times at a period of q. Here, information bits corresponding to degree-5 columns are connected to punctured parity bits through 2 edges, and information bits corresponding to degree-3 columns are not connected to punctured parity bits on the Tanner graph.

Generally, the bits connected to many punctured bits show a poor performance improvement effect in the decoding process. However, in FIG. 11, the degree-5 columns still have 3 edges which are not connected to the punctured bits, so the performance may not be significantly decreased in the decoding process. In addition, since information bits in the degree-3 columns are not directly connected to the punctured parity bits, significant performance degradation may not occur similarly in the decoding process.

It is assumed herein that the degree-5 columns are greater than the degree-3 columns in terms of the performance improvement effect in the decoding process. However, this assumption is valid only for BPSK or QPSK, and cannot always be applied for general high-order modulation.

Figure 12A:
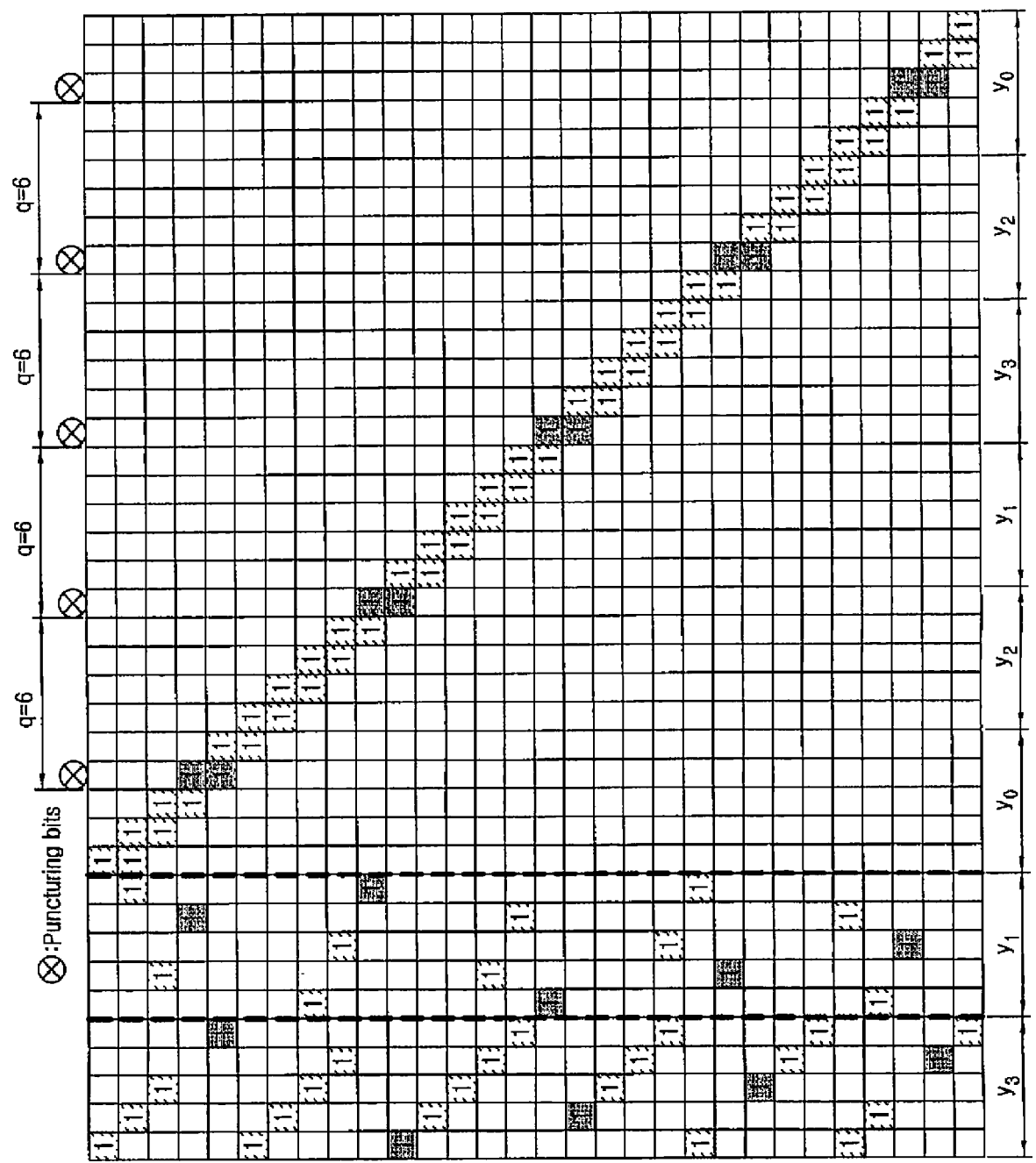
FIG. 12A illustrates an example of a puncturing pattern determined by considering 16QAM transmission in the LDPC code of FIG. 10.

For example, as illustrated in FIG. 12A, 16QAM modulation can be applied to the LDPC code with the parity-check matrix of FIG. 10. In FIG. 12A, $y_0$ and $y_1$ indicate high-reliability bits that determine signs of a real part and an imaginary part in a 16QAM symbol, respectively. That is, the reliability relationship between the bits is defined as $y_0=y_1>y_2=y_3$.

Referring to FIG. 12A, degree-5 columns are mapped to $y_3$ and degree-3 columns are mapped to $y_1$. In other words, the degree-5 columns are mapped to a lower-reliability bit and the degree-3 are mapped to a higher-reliability bit on the signal constellation.

In this case, it cannot be concluded that the degree-5 columns would have a higher performance improvement effect in the decoding process. The reasons are as follows. In light of the characteristics of the 16QAM modulation, since the degree-5 columns are mapped to lower-reliability information in a signal received from a channel, their reliability improvement is made very slowly in the decoding process. On the other hand, the degree-3 columns, though they have a low degree, are mapped to lower-reliability information, so the reliability improvement effect occurs very fast.

As described above, it cannot be guaranteed that the bits corresponding to the higher-degree columns always have superior performance in the LDPC code, to which high-order modulation is applied.

Referring back to FIG. 12A, in an implementation, after a parity bit corresponding to a $4^{th}$ column in a submatrix corresponding to an arbitrary parity bit is punctured, one parity bit is punctured four times at a period of q. Here, information bits in both of degree-5 columns and degree-3 columns are connected to punctured parity bits through 1 edge on the Tanner graph.

In the puncturing pattern applied in FIG. 11, the punctured bits are connected only to the degree-5 columns because the performance improvement effect of the degree-5 columns is high in BPSK or QPSK modulation. However, in the puncturing pattern illustrated in FIG. 12A, the punctured bits are uniformly distributed considering the difference between reliabilities corresponding to each column group based on the modulation scheme. In an analysis of this case, since the degree-5 columns are connected to only one punctured bit, there is a high probability that no more significant performance degradation will happen. Also, though the degree-3 columns are connected to one punctured bit, they correspond to high-reliability information from a received signal, so the probability is high that the significant performance degradation will not occur.

Figure 12B:
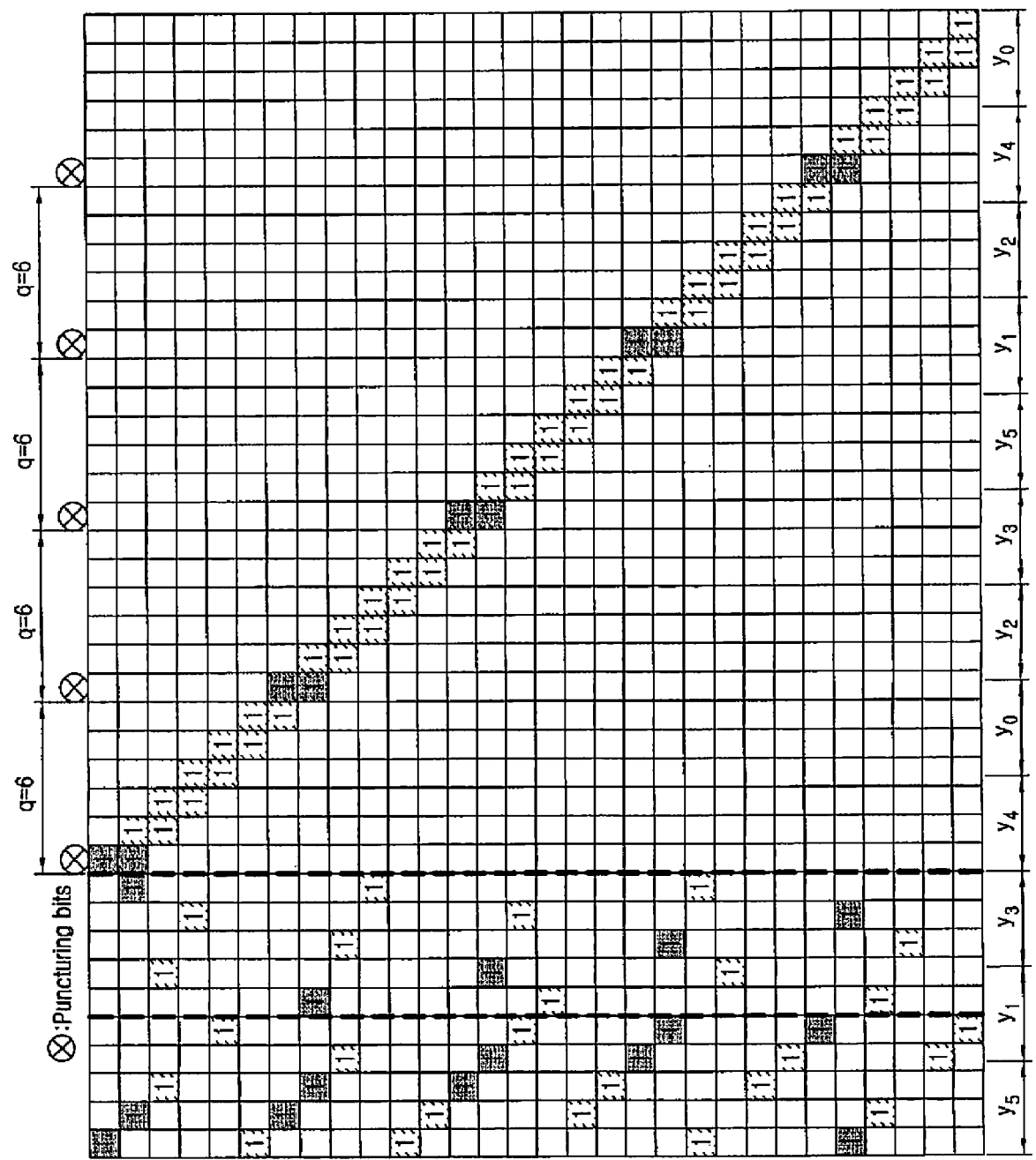
FIG. 12B illustrates an example of a puncturing pattern determined by considering 64QAM transmission in the LDPC code of FIG. 10.

Similarly, even when 64QAM modulation is applied to the LDPC code with the parity-check matrix of FIG. 10 as illustrated in FIG. 12B, the characteristics may be different from those of BPSK, QPSK and 16QAM. In FIG. 12B, $y_0$ and $y_1$ indicate high-reliability bits that determine signs of a real part and an imaginary part in a 64QAM symbol, respectively. That is, reliability relationship between the bits is defined as $y_0=y_1>y_2=y_3>y_4=y_5$.

FIG. 12B illustrates an example of a puncturing pattern obtained by considering parity bits corresponding to degree-2 columns. In FIG. 12A for 16QAM, though 3 bits among the punctured parity bits are connected to the lowest-reliability bits $y_2$ and $y_3$, since the information bits corresponding to the degree-5 or degree-3 columns have good performance, no performance degradation may occur. However, in FIG. 12B where 64QAM is applied, when too many parity bits are connected to $y_4$ and $y_5$ having very low reliabilities, performance degradation may occur. Hence, the reliabilities corresponding to the parity bits should also be carefully considered.

It should be noted in FIGS. 12A and 12B that when the codeword length of the LDPC code decreases due to shortening or puncturing, orders of bits corresponding to the signal constellation are equal, but the bits decrease in a predetermined ratio. For example, in FIGS. 12A and 12B, for an LDPC code, orders $(y_3, y_1, y_0, y_2, y_1, y_3, y_2, y_0)$ and $(y_5, y_1, y_3, y_4, y_0, y_2, y_3, y_5, y_1, y_2, y_4, y_0)$ of bits corresponding to the signal constellations are maintained, but a ratio of bits corresponding to each signal constellation decreases in proportion to a length of the LDPC codeword.

As described in FIGS. 10, 11, 12A and 12B, it can be easily expected that the same puncturing pattern could be changed according to the modulation scheme. That is, when a high-order modulation scheme and a signal constellation/bit mapping scheme are determined for a given LDPC code, the optimal puncturing pattern is subject to change according to connections between punctured bits and non-punctured other bits. Thus, different puncturing patterns should be applied according to transmission modulation schemes, in order to minimize the performance degradation caused by puncturing.

Figure 13:
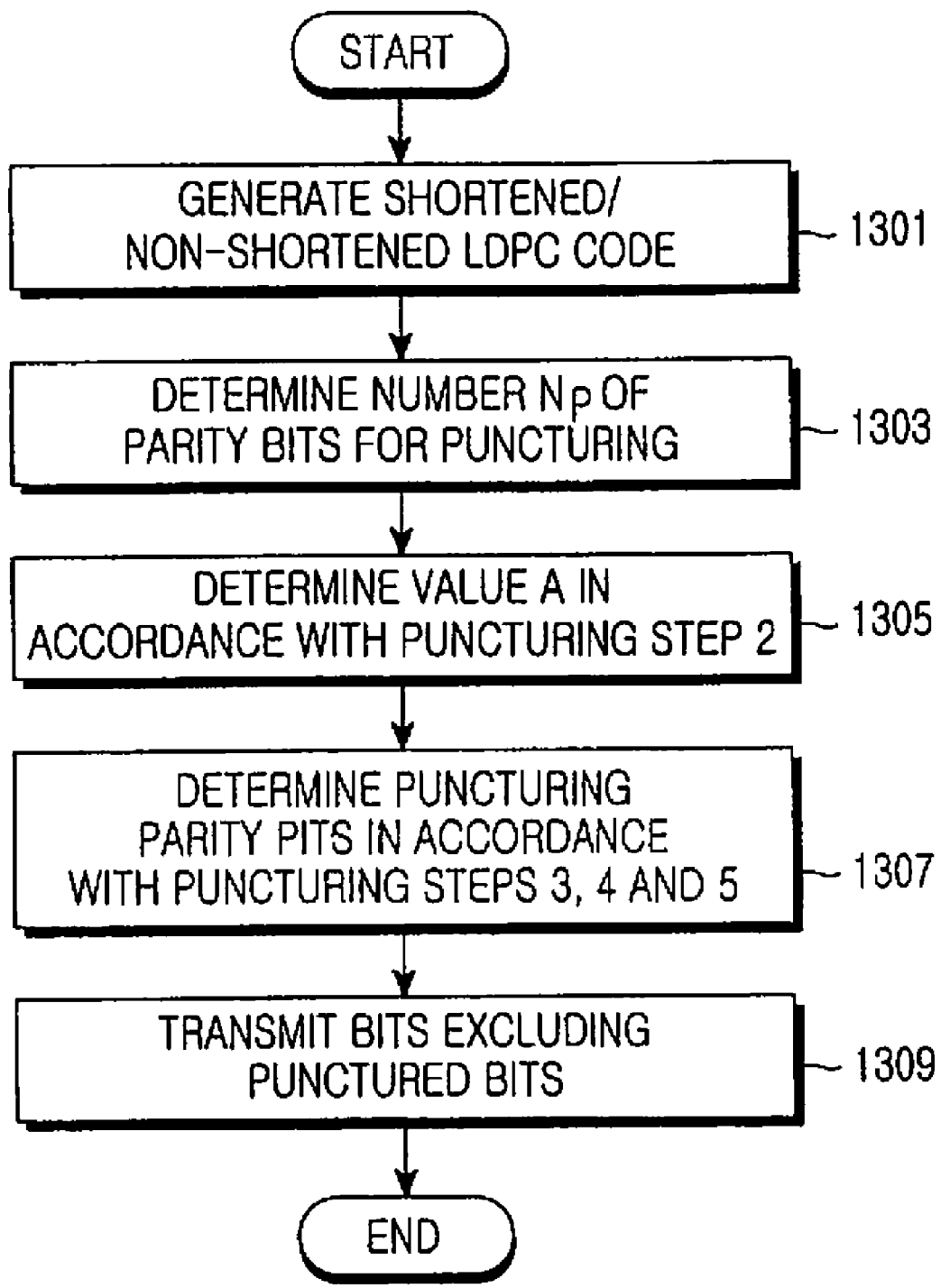
FIG. 13 is a flowchart illustrating a method for generating an LDPC code with a different codeword length from a parity-check matrix of a stored LDPC code according to an embodiment of the present invention.

The general process for applying the above-described puncturing scheme can be summarized in 5 steps as follows. For convenience, it is assumed herein that $N_1$ indicates a length of an LDPC codeword, each column group includes $M_1$ columns, and $N_p$ parity bits are subject to puncturing. The following puncturing process is illustrated in FIG. 13 in brief.

Puncturing Step 1

A transmission apparatus generates an existing shortened/non-shortened DVB-S2 LDPC codeword in step 1301.

Puncturing Step 2

The transmission apparatus determines the number $N_p$ of parity bits for puncturing in step 1303, and finds $$A = \left\lfloor \frac{N_p}{M_1} \right\rfloor$$

in step 1305, where $\lfloor x \rfloor$ is the maximum integer which is less than or equal to x.

Puncturing Step 3

The transmission apparatus determines puncturing parity bits $p_{i_0}, p_{i_1}, \ldots, p_{i_{A-1}}$ for $0 \leq x < A$ and $0 \leq i_x < q$ according to a transmission modulation scheme in step 1307. It is assumed that for $0 \leq x < q$, values of $i_x$ were previously determined using a density evolution method considering the transmission modulation scheme (herein, a relationship of $A \leq q$ is given).

Puncturing Step 4

The transmission apparatus applies puncturing to all parity bits $p_{i_x+kqB}$ for $0 \leq x < A$ and $0 \leq k < M_1$ in step 1307. Here, the constant B is a preset non-zero integer.

Puncturing Step 5

The transmission apparatus additionally punctures the parity bits $p_{i_A+kqB}$ for $0 \leq k < N_p - AM_1$ in step 1307. Thereafter, the transmission apparatus transmits bits except for the punctured bits in step 1309.

It can be understood from Puncturing Step 1 through Puncturing Step 5 that the puncturing pattern can be defined accurately when the number $N_p$ of bits to be punctured, sequence information defining values of $i_x$, and a value of q are known.

To describe detailed examples in which the above puncturing steps are performed according to modulation schemes, less than optimal (i.e. suboptimized) puncturing patterns for an DVB-S2 LDPC code with $N_1=16200$, $K_1=7200$, $M_1=360$, and $q=25$ are shown in Table 1. A process of selecting the suboptimal puncturing patterns will be described in detail below.

In Table 1, $(p_0, p_1, p_2, \ldots, p_{8999})$ indicates all parity bits of the DVB-S2 LDPC code, which are enumerated in a row.

TABLE 1

| Major variables of DVB-S2 LDPC code | $N_1 = 16200$, $K_1 = 7200$, $M_1 = 360$, $q = 25$ |
|---|---|
| Grouping of parity bits | Define a set $P_j$ satisfying the following characteristics for $0 \leq j < q = 25$:<br>$P_j = \{p_k | k \equiv j \bmod 25, 0 \leq k < 9000\}$.<br>The set $P_j$ is a set having 360 parity bits as its entries. |
| Range of $N_p$ | Puncturing Method |
| $0 \leq N_p < 9000$ | For an integer $m = \left\lfloor \frac{N_p}{360} \right\rfloor$, puncture all of parity bits corresponding to m parity bit sets $P_{\pi(0)}, P_{\pi(1)}, \ldots, P_{\pi(m-1)}$, and additionally puncture ($N_p$-360m) parity bits from among the parity bits corresponding to $P_{\pi(m)}$. Here, $\pi$ indicates a permutation function that is a puncturing pattern, and the relationships are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| $\pi(18)$ | $\pi(19)$ | $\pi(20)$ | $\pi(21)$ | $\pi(22)$ | $\pi(23)$ | $\pi(24)$ | — | — |

Relationship between permutation functions suboptimized on BPSK/QPSK

| 6 | 4 | 18 | 9 | 13 | 8 | 15 | 20 | 5 |
|---|---|---|---|---|---|---|---|---|
| 17 | 2 | 24 | 10 | 22 | 12 | 3 | 16 | 23 |
| 1 | 14 | 0 | 21 | 19 | 7 | 11 | — | — |

TABLE 1-continued

Relationship between permutation functions suboptimized on 16 QAM

| 6 | 4 | 13 | 9 | 18 | 8 | 15 | 20 | 5 |
|---|---|---|---|---|---|---|---|---|
| 17 | 2 | 24 | 22 | 14 | 23 | 3 | 19 | 10 |
| 1 | 12 | 0 | 16 | 21 | 7 | 11 | — | — |

Relationship between permutation functions suboptimized on 64 QAM

| 15 | 3 | 23 | 6 | 13 | 18 | 1 | 9 | 17 |
|---|---|---|---|---|---|---|---|---|
| 8 | 5 | 20 | 16 | 22 | 4 | 24 | 14 | 2 |
| 21 | 12 | 7 | 10 | 19 | 11 | 0 | — | — |

Referring to Table 1, it can be appreciated that when a length of parity bits to be punctured is determined, the puncturing process based on suboptimal puncturing patterns is performed through a predetermined process regardless of the modulation scheme, but relationships between permutation functions indicating optimized puncturing patterns are all different according to modulation schemes. That is, when the puncturing method is applied without considering the modulation scheme, significant performance degradation may occur according to modulation schemes.

From the puncturing process, it can also be appreciated that $AM_1$ parity bits are punctured in Puncturing Step 3 and Puncturing Step 4 and $N_p-AM_1$ parity bits are punctured in Puncturing Step 5, so that a total of $N_p$ parity bits are punctured.

The suboptimal puncturing patterns shown in Table 1 may not be unique according to conditions for finding the puncturing patterns. Because several selections are possible in the process of selecting the puncturing patterns, which will be described below in detail, many puncturing patterns showing good performance may be available. Actually, puncturing patterns shown in Table 2 can also provide very excellent performance, like the puncturing patterns defined in Table 1.

TABLE 2

| Major variables of DVB-S2 LDPC code | $N_1 = 16200$, $K_1 = 7200$, $M_1 = 360$, $q = 25$ |
|---|---|
| Grouping of parity bits | Define a set $P_j$ satisfying the following characteristics for $0 \leq j < q = 25$:<br>$P_j = \{p_k | k \equiv j \bmod 25, 0 \leq k < 9000\}$.<br>The set $P_j$ is a set having 360 parity bits as its entries. |
| Range of $N_p$ | Puncturing Method |
| $0 \leq N_p < 9000$ | For an integer $m = \left\lfloor \frac{N_p}{360} \right\rfloor$, puncture all of parity bits corresponding to m parity bit sets $P_{\pi(0)}, P_{\pi(1)}, \ldots, P_{\pi(m-1)}$, and additionally puncture ($N_p$-360m) parity bits from among the parity bits corresponding to $P_{\pi(m)}$. Here, $\pi$ indicates a permutation function that is a puncturing pattern, and the relationships are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| $\pi(18)$ | $\pi(19)$ | $\pi(20)$ | $\pi(21)$ | $\pi(22)$ | $\pi(23)$ | $\pi(24)$ | — | — |

Relationship between permutation functions suboptimized on BPSK/QPSK

| 6 | 4 | 18 | 9 | 13 | 8 | 15 | 20 | 5 |
|---|---|---|---|---|---|---|---|---|
| 17 | 2 | 24 | 10 | 22 | 12 | 3 | 16 | 23 |
| 1 | 14 | 0 | 21 | 19 | 7 | 11 | — | — |

Relationship between permutation functions suboptimized on 16 QAM

| 6 | 4 | 13 | 9 | 18 | 8 | 15 | 20 | 5 |
|---|---|---|---|---|---|---|---|---|
| 17 | 2 | 22 | 24 | 7 | 12 | 1 | 16 | 23 |
| 14 | 0 | 21 | 10 | 19 | 11 | 3 | — | — |

TABLE 2-continued

Relationship between permutation functions suboptimized on 64 QAM

| 6 | 15 | 13 | 10 | 3  | 17 | 21 | 8 | 5  |
|---|----|----|----|----|----|----|---|----|
| 19| 2  | 23 | 16 | 24 | 7  | 18 | 1 | 12 |
| 20| 0  | 4  | 14 | 9  | 11 | 22 | — | —  |

The method of mapping bits corresponding to the signal constellations used in 16QAM and 64QAM modulations of Table 2 is the results obtained by applying the same bit mapping schemes as those illustrated in FIGS. 12A and 12B.

Figure 14:
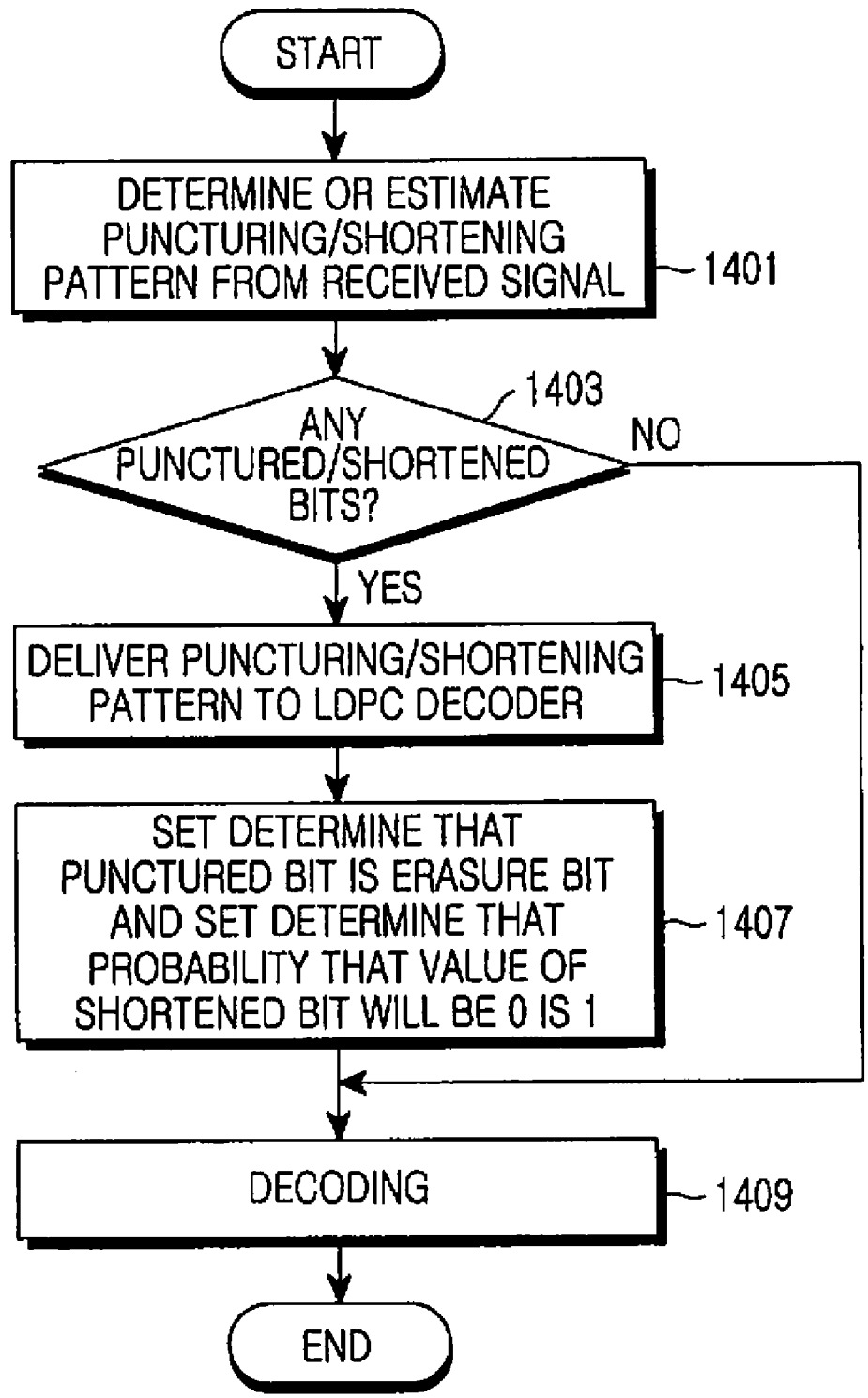
FIG. 14 is a flowchart illustrating an LDPC decoding method in a reception apparatus according to an embodiment of the present invention.

The DVB-S2 LDPC codeword transmitted after undergoing the puncturing is restored to its original signal from a received signal at a reception apparatus through a decoding process in FIG. 14.

FIG. 14 is a flowchart illustrating a reception method in a reception apparatus according to an embodiment of the present invention.

Referring to FIG. 14, a reception apparatus determines or estimates a puncturing/shortening pattern from a received signal in step 1401. Thereafter, the reception apparatus determines in step 1403 whether there are any punctured or shortened bits. In the absence of punctured or shortened bits, the reception apparatus performs decoding in step 1409. However, when there are punctured or shortened bits, the reception apparatus provides the puncturing/shortening pattern to an LDPC encoder 1560, which will be described in connection with FIG. 15, in step 1405.

In step 1407, the LDPC encoder 1560 determines that punctured bits are erased bits and determines that the probability that values of shortened bits will be zero (0) is 1. Thereafter, the LDPC encoder 1560 performs decoding in step 1409.

In the puncturing process, q-periodic puncturing is applied to stabilize performance of the DVB-S2 LDPC code using structural characteristics of the DVB-S2 LDPC code.

A most significant difference between the present invention and the prior art lies in considering reliability of the transmission modulation scheme when determining parity bits to be punctured in Puncturing Step 3. An example of a sequence selection procedure is provided here below to determine the bits to be punctured in the DVB-S2 LDPC code in Puncturing Step 3. The following selection procedure is subject to change, when applied to other LDPC codes.

Selection Process 1

Bits, which are connected, if possible, to a less number of information bits, are first determined.

Selection Process 2

Parity bits to be punctured, which exhibit the most asymptotic performance, are determined from the parity bits determined in Selection Process 1, using a density evolution analysis method that considers both a modulation scheme and degree distribution.

Selection Process 3

Based on the parity bits to be punctured, determined in Selection Process 2, Selection Process 1 and Selection Process 2 are repeated on the bits excluding the already selected bits to be punctured.

Commonly, when the number $N_p$ of bits to be punctured varies greatly, the puncturing patterns optimized based on the value of $N_p$ may have no correlation with each other. In other words, in a system where the value of $N_p$ varies greatly, all of the puncturing patterns optimized based on the value of $N_p$ should be stored separately for optimized performance.

However, although the puncturing patterns obtained by applying the above selection procedure are not guaranteed to be optimal for all cases, they would have relatively stable performance from one puncturing pattern having a regular rule, regardless of a change in the value of $N_p$, thereby securing the relatively stable performance and easy storage of the puncturing patterns.

For example, supposing that orders of the parity bits to be punctured are set as $P_1, P_2, \ldots, P_q$, only a sequence indicating the orders of the parity bits may be stored to enable efficient puncturing for an arbitrary value of $N_p$ through Puncturing Step 1 to Puncturing Step 5.

The puncturing technique may contribute to an increase in a code rate because it can change a length of an LDPC codeword, and reduce the codeword length without changing an information length. Preferably, the puncturing and the shortening can be applied together to obtain the code rate and codeword length needed in the system.

Assuming, as described above, that a codeword length and an information length of an LDPC code, which is intended to be finally obtained from a given LDPC code with a codeword length $N_1$ and an information length $K_1$ through shortening and puncturing, are $N_2$ and $K_2$, respectively, if a definition of $N_1 - N_2 = N_\Delta$ and $K_1 - K_2 = K_\Delta$ is given, the LDPC code with a codeword length $N_2$ and an information length $K_2$ can be generated by shortening $K_\Delta$ bits and puncturing $N_p (= N_\Delta - K_\Delta)$ bits from a parity-check matrix of the given LDPC code. In case of the generated LDPC code, for $N_\Delta > 0$ or $K_\Delta > 0$, since the code rate is $$\frac{K_1 - K_\Delta}{N_1 - N_\Delta},$$

the puncturing and shortening lengths can be set considering $N_2$ and $$\frac{K_1 - K_\Delta}{N_1 - N_\Delta}.$$

Figure 15:
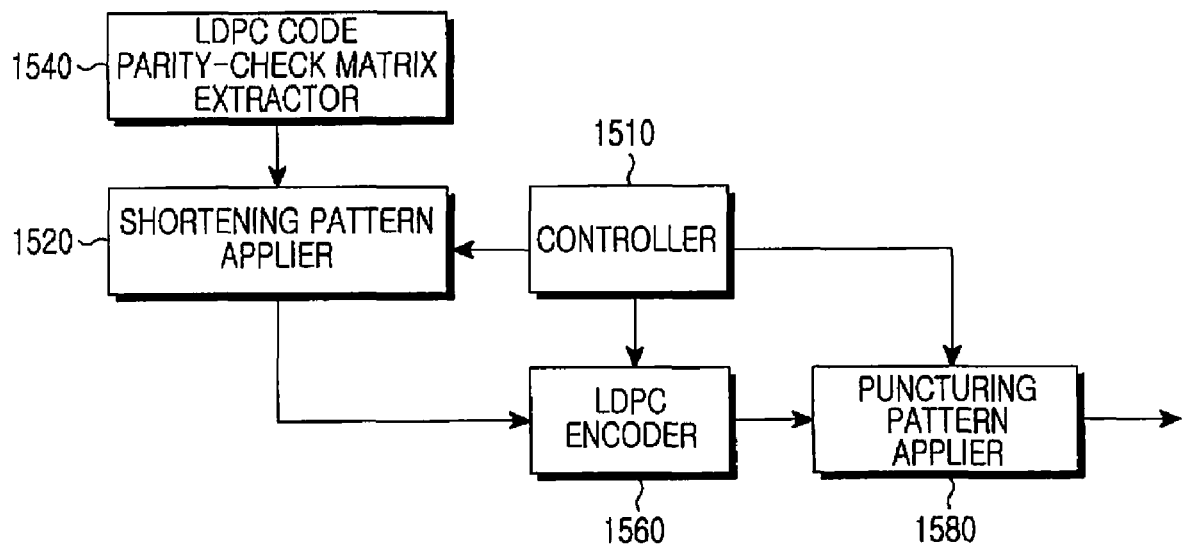
FIG. 15 is a block diagram of a transmission apparatus using a punctured/shortened LDPC code according to an embodiment of the present invention.

FIG. 15 is a block diagram of a transmission apparatus using a punctured/shortened LDPC code according to an embodiment of the present invention.

Referring to FIG. 15, a transmission apparatus includes a controller 1510, a shortening pattern applier 1520, an LDPC code parity-check matrix extractor 1540, an LDPC encoder 1560, and a puncturing pattern applier 1580.

The LDPC code parity-check matrix extractor 1540 extracts an LDPC code parity-check matrix that underwent shortening. The LDPC code parity-check matrix can be extracted using a memory, can be given in the transmission apparatus, or can be generated by the transmission apparatus.

The controller 1510 controls the shortening pattern applier 1520 to determine a shortening pattern according to an information length. The shortening pattern applier 1520 inserts bits with a value of 0 in the positions corresponding to shortened bits, or removes columns corresponding to the shortened bits from a parity-check matrix of a given LDPC code. The shortening pattern can determined by extracting a shortening pattern stored in a memory, generating a shortening pattern using a sequence generator (not shown), or obtaining a shortening pattern using a density evolution analysis algorithm for a parity-check matrix and a given information length.

The shortening pattern applier 1520 is optional when shortening is not needed for the code. Further, the controller 1510 controls the puncturing pattern applier 1580 to determine and apply a puncturing pattern according to a modulation scheme and a length of puncturing bits.

The puncturing pattern applier 1580 determines the number of parity bits for puncturing, divides the parity bits at predetermined intervals, determines the number of puncturing bits, which are subjected to puncturing within the predetermined intervals, determines a modulation scheme, determines positions of puncturing parity bits corresponding to the determined number of the puncturing bits within the predetermined intervals according to the determined modulation scheme, and repeatedly performs puncturing on the puncturing parity bits corresponding to the determined positions at the predetermined intervals. The predetermined intervals are determined by dividing a length of the parity bits by a length of one column group in a parity-check matrix.

The remaining bits except for the punctured bits are transmitted to a receiver according to the modulation scheme through a transmission unit (not shown).

The LDPC encoder 1560 performs encoding based on the LDPC code shortened by the controller 1510 and the shortening pattern applier 1520.

Figure 16:
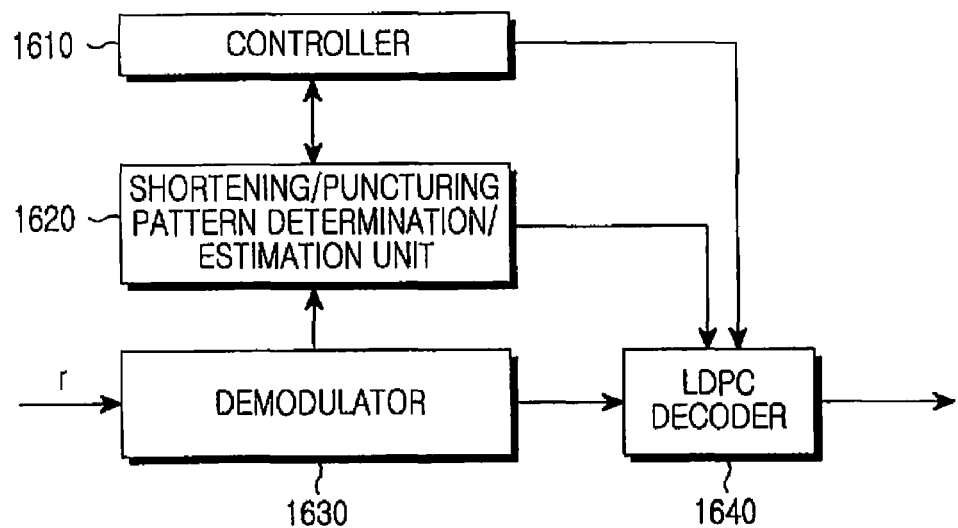
FIG. 16 is a block diagram of a reception apparatus using a punctured/shortened LDPC code according to an embodiment of the present invention.

FIG. 16 is a block diagram of a reception apparatus according to an embodiment of the present invention, in which a signal transmitted from a communication system using a punctured/shortened DVB-S2 LDPC code is received, and restored to user-desired data.

Referring to FIG. 16, a reception apparatus includes a controller 1610, a shortening/puncturing pattern determination/estimation unit 1620, a demodulator 1630, and an LDPC decoder 1640.

The demodulator 1630 receives and demodulates a shortened/punctured LDPC code, and provides the demodulated signal to the shortening/puncturing pattern determination/estimation unit 1620 and the LDPC decoder 1640.

The shortening/puncturing pattern determination/estimation unit 1620, under the control of the controller 1610, estimates or determines information about a puncturing/shortening pattern of the LDPC code from demodulated signal, and provides position information of the punctured/shortened bits to the LDPC decoder 1640. The shortening/puncturing pattern determination/estimation unit 1620 can determine or estimate the puncturing/shortening pattern by extracting a puncturing/shortening pattern stored in a memory, generating a puncturing/shortening pattern using a previously implemented generation method, or obtaining a puncturing/shortening pattern using a density evolution analysis algorithm for a parity-check matrix and a given information length. The LDPC decoder 1640 performs erasure processing on the punctured bits and performs decoding thereon.

When the transmission apparatus applies both shortening and puncturing, the shortening/puncturing pattern determination/estimation unit 1620 in the reception apparatus may carry out pattern determination/estimation on the shortening first, perform pattern determination/estimation on the puncturing first, or make pattern determination/estimation on both the shortening and puncturing. The shortening/puncturing pattern determination/estimation unit 1620 determines presence/absence of puncturing bits in the demodulated signal. When there are puncturing bits, the shortening/puncturing pattern determination/estimation unit 1620 determines positions of the punctured parity bits by estimating information about the puncturing pattern.

The LDPC decoder 1640 decodes data using the determined positions of the punctured parity bits, assuming that the probability that the punctured bits would be zero (0) and the probability that the punctured bits would be 1 are equal to ½. Because the probability that values of the shortened bits will be zero is 1 (i.e. 100%), the LDPC decoder 1640 determines whether or not it will allow the shortened bits to take part in its decoding operation depending on the value 1 of the probability that the shortened bits would be zero. When the LDPC decoder 1640 receives information on a length of the shortened DVB-S2 LDPC code by means of the shortening/puncturing pattern determination/estimation unit 1620, the LDPC decoder 1640 restores the user-desired data from the received signals.

As described in connection with FIG. 15, the shortening is performed in the input stage of the LDPC encoder 1560 and the puncturing is performed at the output stage of the LDPC encoder 1560. However, in the reception apparatus illustrated in FIG. 16, the LDPC decoder 1640 should have information on the puncturing and the shortening simultaneously, to make the decoding possible.

As is apparent from the foregoing description, the embodiments of the present invention can generate a separate LDPC code with a different codeword length by optimizing encoding/decoding performance using information on a given parity-check matrix in the communication system that uses high-order modulation and LDPC codes.

While the invention has been shown and described with reference to a certain exemplary embodiments thereof, it will be understood by those skilled in the art that various changes in form and details may be made therein without departing from the spirit and scope of the invention as defined by the appended claims and their equivalents.

What is claimed is:

1. A method for encoding a channel in a communication system using a Low-Density Parity-Check (LDPC) code, the method comprising:
    determining a number of parity bits for puncturing;
    dividing the parity bits at predetermined intervals, and determining a number of puncturing parity bits, which are subjected to puncturing within the predetermined intervals;
    determining a modulation scheme;
    determining positions of puncturing parity bits corresponding to the determined number of the puncturing parity bits within the predetermined intervals according to the modulation scheme;
    repeatedly performing puncturing on puncturing parity bits corresponding to the determined positions at the predetermined intervals; and
    transmitting remaining bits except for the punctured bits according to the modulation scheme.

2. The method of claim 1, wherein the predetermined intervals are determined by dividing a length of the parity bits by a length of one column group in a parity-check matrix.

3. The method of claim 1, wherein when a codeword length is 16200, an information length is 7200 and the modulation scheme is 16QAM, the positions of the puncturing parity bits are 6, 4, 13, 9, 18, 15, 20, 5, 17, 2, 24, 10, 22, 12, 3, 16, 23, 14, 0, 21, 10, 19, 11, 3.

4. The method of claim 1, wherein when a codeword length is 16200, an information length is 7200 and the modulation scheme is 64QAM, the positions of the puncturing parity bits are 6, 15, 13, 10, 3, 17, 21, 8, 5, 19, 2, 23, 16, 24, 7, 18, 1, 12, 20, 0, 4, 14, 9, 11, 22.

5. The method of claim 1, wherein the positions of the puncturing parity bits are determined based on connections between punctured bits and non-punctured bits and reliabilities of bits that constitute a modulation symbol according to the modulation scheme.

6. The method of claim 1, further comprising:
additionally puncturing remaining parity bits except for the punctured parity bits when the number of the parity bits for puncturing is not a multiple of the length of one column group.

7. The method of claim 1, wherein when the modulation scheme is 16QAM, an LDPC code with a codeword length of 16200 and an information length of 7200 is subjected to puncturing in accordance with the following puncturing pattern

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 13 | 9 | 18 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 22 | 24 | 7 | 12 | 1 | 16 | 23 |
| $\pi(18)$ | $\pi(19)$ | $\pi(20)$ | $\pi(21)$ | $\pi(22)$ | $\pi(23)$ | $\pi(24)$ | | |
| 14 | 0 | 21 | 10 | 19 | 11 | 3. | | |

8. The method of claim 1, wherein when the modulation scheme is 64QAM, an LDPC code with a codeword length of 16200 and an information length of 7200 is subjected to puncturing in accordance with the following puncturing pattern

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 15 | 13 | 10 | 3 | 17 | 21 | 8 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 19 | 2 | 23 | 16 | 24 | 7 | 18 | 1 | 12 |
| $\pi(18)$ | $\pi(19)$ | $\pi(20)$ | $\pi(21)$ | $\pi(22)$ | $\pi(23)$ | $\pi(24)$ | | |
| 20 | 0 | 4 | 14 | 9 | 11 | 22. | | |

9. A method for encoding a channel in a communication system using a Low-Density Parity-Check (LDPC) code, the method comprising:
puncturing according to a predetermined puncturing pattern based on the modulation scheme; and
transmitting remaining bits except for the punctured bits according to the modulation scheme,
wherein when the modulation scheme is 16QAM, an LDPC code with a codeword length of 16200 and an information length of 7200 is subjected to puncturing in accordance with the following puncturing pattern

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 13 | 9 | 18 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 22 | 24 | 7 | 12 | 1 | 16 | 23 |
| $\pi(18)$ | $\pi(19)$ | $\pi(20)$ | $\pi(21)$ | $\pi(22)$ | $\pi(23)$ | $\pi(24)$ | | |
| 14 | 0 | 21 | 10 | 19 | 11 | 3. | | |

10. The method of claim 9, wherein the positions of the puncturing parity bits are determined considering connections between punctured bits and non-punctured bits and reliabilities of bits that constitute a modulation symbol according to the modulation scheme.

11. A method for encoding a channel in a communication system using a Low-Density Parity-Check (LDPC) code, the method comprising:
puncturing according to a predetermined puncturing pattern based on the modulation scheme; and
transmitting remaining bits except for the punctured bits according to the modulation scheme,
wherein when the modulation scheme is 64QAM, an LDPC code with a codeword length of 16200 and an information length of 7200 is subjected to puncturing in accordance with the following puncturing pattern

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 15 | 13 | 10 | 3 | 17 | 21 | 8 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 19 | 2 | 23 | 16 | 24 | 7 | 18 | 1 | 12 |
| $\pi(18)$ | $\pi(19)$ | $\pi(20)$ | $\pi(21)$ | $\pi(22)$ | $\pi(23)$ | $\pi(24)$ | | |
| 20 | 0 | 4 | 14 | 9 | 11 | 22. | | |

12. The method of claim 11, wherein the positions of the puncturing parity bits are determined considering connections between punctured bits and non-punctured bits and reliabilities of bits that constitute a modulation symbol according to the modulation scheme.

13. An apparatus for encoding a channel in a communication system using a Low-Density Parity-Check (LDPC) code, the apparatus comprising:
a puncturing pattern applier for repeatedly performing puncturing on puncturing parity bits corresponding to the determined positions at the predetermined intervals; and
a transmission unit for transmitting remaining bits except for the punctured bits according to the modulation scheme,
wherein the predetermined intervals are determined by dividing a length of the parity bits by a length of one column group in a parity-check matrix.

14. The apparatus of claim 13, wherein the puncturing pattern applier determines the positions of the puncturing parity bits considering connections between punctured bits and non-punctured bits and reliabilities of bits that constitute a modulation symbol according to the modulation scheme.

15. The apparatus of claim 13, wherein when the modulation scheme is 16QAM, the puncturing pattern applier performs puncturing on an LDPC code with a codeword length of 16200 and an information length of 7200 in accordance with the following puncturing pattern

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 13 | 9 | 18 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 22 | 24 | 7 | 12 | 1 | 16 | 23 |
| $\pi(18)$ | $\pi(19)$ | $\pi(20)$ | $\pi(21)$ | $\pi(22)$ | $\pi(23)$ | $\pi(24)$ | | |
| 14 | 0 | 21 | 10 | 19 | 11 | 3. | | |

16. The apparatus of claim 13, wherein when the modulation scheme is 64QAM, the puncturing pattern applier performs puncturing on an LDPC code with a codeword length of 16200 and an information length of 7200 in accordance with the following puncturing pattern

| π(0) | π(1) | π(2) | π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | π(12) | π(13) | π(14) | π(15) | π(16) | π(17) |
| 19 | 2 | 23 | 16 | 24 | 7 | 18 | 1 | 12 |
| π(18) | π(19) | π(20) | π(21) | π(22) | π(23) | π(24) | | |
| 20 | 0 | 4 | 14 | 9 | 11 | 22. | | |

17. An apparatus for encoding a channel in a communication system using a Low-Density Parity-Check (LDPC) code, the apparatus comprising:
 a puncturing pattern applier for puncturing according to a predetermined puncturing pattern based on the modulation scheme; and
 a transmission unit for transmitting remaining bits except for the punctured bits according to the modulation scheme,
 wherein when the modulation scheme is 16QAM, the puncturing pattern applier performs puncturing on an LDPC code with a codeword length of 16200 and an information length of 7200 in accordance with the following puncturing pattern

| π(0) | π(1) | π(2) | π(3) | π(4) | π(5) | π(6) | π(7) | π(8) |
|---|---|---|---|---|---|---|---|---|
| 6 | 4 | 13 | 9 | 18 | 8 | 15 | 20 | 5 |
| π(9) | π(10) | π(11) | π(12) | π(13) | π(14) | π(15) | π(16) | π(17) |
| 17 | 2 | 22 | 24 | 7 | 12 | 1 | 16 | 23 |
| π(18) | π(19) | π(20) | π(21) | π(22) | π(23) | π(24) | | |
| 14 | 0 | 21 | 10 | 19 | 11 | 3. | | |

18. The apparatus of claim 17, wherein the puncturing pattern applier determines the positions of the puncturing parity bits considering connections between punctured bits and non-punctured bits and reliabilities of bits that constitute a modulation symbol according to the modulation scheme.

19. An apparatus for encoding a channel in a communication system using a Low-Density Parity-Check (LDPC) code, the apparatus comprising:
 a puncturing pattern applier for performing puncturing according to a predetermined puncturing pattern based on the modulation scheme; and
 a transmission unit for transmitting remaining bits except for the punctured bits according to the modulation scheme,
 wherein when the modulation scheme is 64QAM, the puncturing pattern applier performs puncturing on an LDPC code with a codeword length of 16200 and an information length of 7200 in accordance with the following puncturing pattern

| π(0) | π(1) | π(2) | π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | π(12) | π(13) | π(14) | π(15) | π(16) | π(17) |
| 19 | 2 | 23 | 16 | 24 | 7 | 18 | 1 | 12 |
| π(18) | π(19) | π(20) | π(21) | π(22) | π(23) | π(24) | | |
| 20 | 0 | 4 | 14 | 9 | 11 | 22. | | |

20. The apparatus of claim 19, wherein the puncturing pattern applier determines the positions of the puncturing parity bits considering connections between punctured bits and non-punctured bits and reliabilities of bits that constitute a modulation symbol according to the modulation scheme.

21. A method for decoding a channel in a communication system using a Low-Density Parity-Check (LDPC) code, the method comprising:
 demodulating a signal transmitted from a transmitter;
 determining if there are any punctured parity bits in the demodulated signal;
 determining positions of the punctured parity bits by estimating information about a puncturing pattern when there are punctured parity bits; and
 decoding data using the positions of the punctured parity bits,
 wherein the information about the puncturing pattern includes a puncturing pattern obtained by considering a modulation scheme; and
 wherein determining positions of the punctured bits comprises,
 determining a number of punctured bits; and
 determining positions of punctured bits corresponding to the determined number of the punctured bits in consideration of a predetermined interval;
 wherein the predetermined interval are determined by dividing a length of the parity bits by a length of one column group in a parity-check matrix.

22. The method of claim 21, wherein when a codeword length is 16200, an information length is 7200 and the modulation scheme is 16QAM, the positions of the puncturing parity bits are 6, 4, 13, 9, 18, 15, 20, 5, 17, 2, 24, 10, 22, 12, 3, 16, 23, 14, 0, 21, 10, 19, 11, 3.

23. The method of claim 21, wherein when a codeword length is 16200, an information length is 7200 and the modulation scheme is 64QAM, the positions of the puncturing parity bits are 6, 15, 13, 10, 3, 17, 21, 8, 5, 19, 2, 23, 16, 24, 7, 18, 1, 12, 20, 0, 4, 14, 9, 11, 22.

24. The method of claim 21, wherein the positions of the punctured parity bits are determined considering connections between punctured bits and non-punctured bits and reliabilities of bits that constitute a modulation symbol according to the modulation scheme.

25. The method of claim 21, further comprising:
 determining that remaining parity bits except for the punctured parity bits are additionally punctured, when the number of the parity bits for puncturing is not a multiple of the length of one column group.

26. The method of claim 21, wherein when the modulation scheme is 16QAM, a codeword length is 16200, and information length is 7200, the information about the puncturing pattern includes the following puncturing pattern

| π(0) | π(1) | π(2) | π(3) | π(4) | π(5) | π(6) | π(7) | π(8) |
|---|---|---|---|---|---|---|---|---|
| 6 | 4 | 13 | 9 | 18 | 8 | 15 | 20 | 5 |
| π(9) | π(10) | π(11) | π(12) | π(13) | π(14) | π(15) | π(16) | π(17) |
| 17 | 2 | 22 | 24 | 7 | 12 | 1 | 16 | 23 |
| π(18) | π(19) | π(20) | π(21) | π(22) | π(23) | π(24) | | |
| 14 | 0 | 21 | 10 | 19 | 11 | 3. | | |

27. The method of claim 21, wherein when the modulation scheme is 64QAM, a codeword length is 16200, and information length is 7200, the information about the puncturing pattern includes the following puncturing pattern

| π(0) | π(1) | π(2) | Π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | Π(12) | π(13) | π(14) | π(15) | π(16) | π(17) |
| 19 | 2 | 23 | 16 | 24 | 7 | 18 | 1 | 12 |
| π(18) | π(19) | π(20) | Π(21) | π(22) | π(23) | π(24) | | |
| 20 | 0 | 4 | 14 | 9 | 11 | 22. | | |

28. A method for decoding a channel in a communication system using a Low-Density Parity-Check (LDPC) code, the method comprising:
demodulating a signal transmitted from a transmitter; and
determining positions of punctured parity bits according to a predetermined puncturing pattern,
wherein when a modulation scheme determined by the transmitter is 16QAM, puncturing performed on an LDPC code with a codeword length of 16200 and an information length of 7200 is estimated in accordance with the following puncturing pattern

| π(0) | π(1) | π(2) | π(3) | π(4) | π(5) | π(6) | π(7) | π(8) |
|---|---|---|---|---|---|---|---|---|
| 6 | 4 | 13 | 9 | 18 | 8 | 15 | 20 | 5 |
| π(9) | π(10) | π(11) | π(12) | π(13) | π(14) | π(15) | π(16) | π(17) |
| 17 | 2 | 22 | 24 | 7 | 12 | 1 | 16 | 23 |
| π(18) | π(19) | π(20) | π(21) | π(22) | π(23) | π(24) | | |
| 14 | 0 | 21 | 10 | 19 | 11 | 3. | | |

29. The method of claim 28, wherein the positions of the punctured parity bits are determined considering connections between punctured bits and non-punctured bits and reliabilities of bits that constitute a modulation symbol according to the modulation scheme.

30. A method for decoding a channel in a communication system using a Low-Density Parity-Check (LDPC) code, the method comprising:
demodulating a signal transmitted from a transmitter; and
determining positions of punctured parity bits according to a predetermined puncturing pattern,
wherein when a modulation scheme determined by the transmitter is 64QAM, puncturing performed on an LDPC code with a codeword length of 16200 and an information length of 7200 is estimated in accordance with the following puncturing pattern

| π(0) | π(1) | π(2) | π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | π(12) | π(13) | π(14) | π(15) | π(16) | π(17) |
| 19 | 2 | 23 | 16 | 24 | 7 | 18 | 1 | 12 |
| π(18) | π(19) | π(20) | π(21) | π(22) | π(23) | π(24) | | |
| 20 | 0 | 4 | 14 | 9 | 11 | 22. | | |

31. The method of claim 30, wherein the positions of the punctured parity bits are determined considering connections between punctured bits and non-punctured bits and reliabilities of bits that constitute a modulation symbol according to the modulation scheme.

32. An apparatus for decoding a channel in a communication system using a Low-Density Parity-Check (LDPC) code, the apparatus comprising:
a demodulator for demodulating a signal transmitted from a transmitter;
a puncturing pattern estimator for determining positions of the punctured parity bits by estimating information about a puncturing pattern when there are punctured parity bits; and
a decoder for decoding data using the positions of the punctured parity bits,
wherein the information about the puncturing pattern includes a puncturing pattern obtained by considering a modulation scheme; and
wherein determining positions of the punctured bits comprises,
determining a number of punctured bits; and
determining positions of punctured bits corresponding to the determined number of the punctured bits in consideration of a predetermined interval;
wherein the predetermined interval are determined by dividing a length of the parity bits by a length of one column group in a parity-check matrix.

33. The apparatus of claim 32, wherein the positions of the punctured parity bits are determined considering connections between punctured bits and non-punctured bits and reliabilities of bits that constitute a modulation symbol according to the modulation scheme.

34. The apparatus of claim 32, wherein when the modulation scheme is 16QAM, a codeword length is 16200, and information length is 7200, the information about the puncturing pattern includes the following puncturing pattern

| π(0) | π(1) | π(2) | Π(3) | π(4) | π(5) | π(6) | π(7) | π(8) |
|---|---|---|---|---|---|---|---|---|
| 6 | 4 | 13 | 9 | 18 | 8 | 15 | 20 | 5 |
| π(9) | π(10) | π(11) | Π(12) | π(13) | π(14) | π(15) | π(16) | π(17) |
| 17 | 2 | 22 | 24 | 7 | 12 | 1 | 16 | 23 |
| π(18) | π(19) | π(20) | Π(21) | π(22) | π(23) | π(24) | | |
| 14 | 0 | 21 | 10 | 19 | 11 | 3. | | |

35. The apparatus of claim 32, wherein when the modulation scheme is 64QAM, a codeword length is 16200, and information length is 7200, the information about the puncturing pattern includes the following puncturing pattern

| π(0) | π(1) | π(2) | π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | π(12) | π(13) | π(14) | π(15) | π(16) | π(17) |
| 19 | 2 | 23 | 16 | 24 | 7 | 18 | 1 | 12 |
| π(18) | π(19) | π(20) | π(21) | π(22) | π(23) | π(24) | | |
| 20 | 0 | 4 | 14 | 9 | 11 | 22. | | |

36. An apparatus for decoding a channel in a communication system using a Low-Density Parity-Check (LDPC) code, the apparatus comprising:
a demodulator for demodulating a signal transmitted from a transmitter; and
a puncturing pattern estimator for determining positions of punctured parity bits according to a predetermined puncturing pattern,
wherein when a modulation scheme determined by the transmitter is 16QAM, puncturing performed on an LDPC code with a codeword length of 16200 and an information length of 7200 is estimated in accordance with the following puncturing pattern

| π(0) | π(1) | π(2) | π(3) | π(4) | π(5) | π(6) | π(7) | π(8) |
|---|---|---|---|---|---|---|---|---|
| 6 | 4 | 13 | 9 | 18 | 8 | 15 | 20 | 5 |
| π(9) | π(10) | π(11) | π(12) | π(13) | π(14) | π(15) | π(16) | π(17) |
| 17 | 2 | 22 | 24 | 7 | 12 | 1 | 16 | 23 |
| π(18) | π(19) | π(20) | π(21) | π(22) | π(23) | π(24) | | |
| 14 | 0 | 21 | 10 | 19 | 11 | 3. | | |

37. The apparatus of claim 36, wherein the positions of the punctured parity bits are determined considering connections between punctured bits and non-punctured bits and reliabilities of bits that constitute a modulation symbol according to the modulation scheme.

38. An apparatus for decoding a channel in a communication system using a Low-Density Parity-Check (LDPC) code, the apparatus comprising:
a demodulator for demodulating a signal transmitted from a transmitter; and
a puncturing pattern estimator for determining positions of punctured parity bits according to a predetermined puncturing pattern,
wherein when a modulation scheme determined by the transmitter is 64QAM, puncturing performed on an LDPC code with a codeword length of 16200 and an information length of 7200 is estimated in accordance with the following puncturing pattern

| π(0) | π(1) | π(2) | π(3) | π(4) | π(5) | π(6) | π(7) | π(8) |
|---|---|---|---|---|---|---|---|---|
| 6 | 15 | 13 | 10 | 3 | 17 | 21 | 8 | 5 |
| π(9) | π(10) | π(11) | π(12) | π(13) | π(14) | π(15) | π(16) | π(17) |
| 19 | 2 | 23 | 16 | 24 | 7 | 18 | 1 | 12 |
| π(18) | π(19) | π(20) | π(21) | π(22) | π(23) | π(24) | | |
| 20 | 0 | 4 | 14 | 9 | 11 | 22. | | |

39. The apparatus of claim 38, wherein the positions of the punctured parity bits are determined considering connections between punctured bits and non-punctured bits and reliabilities of bits that constitute a modulation symbol according to the modulation scheme.

* * * * *